(12) United States Patent
Westbrook et al.

(10) Patent No.: US 11,428,724 B2
(45) Date of Patent: Aug. 30, 2022

(54) TESTING SYSTEMS AND METHODS

(71) Applicant: Kinney Industries, Inc., Huntsville, AL (US)

(72) Inventors: Todd Westbrook, Huntsville, AL (US); Peter Narbus, Huntsville, AL (US)

(73) Assignee: Kinney Industries, Inc., Huntsville, AL (US)

( * ) Notice: Subject to any disclaimer, the term of this patent is extended or adjusted under 35 U.S.C. 154(b) by 1072 days.

(21) Appl. No.: 14/863,207

(22) Filed: Sep. 23, 2015

(65) Prior Publication Data

US 2016/0084902 A1  Mar. 24, 2016

Related U.S. Application Data

(60) Provisional application No. 62/126,345, filed on Feb. 27, 2015, provisional application No. 62/054,668, filed on Sep. 24, 2014.

(51) Int. Cl.
| | |
|---|---|
| *G01R 31/58* | (2020.01) |
| *G01R 31/00* | (2006.01) |
| *G01R 31/50* | (2020.01) |
| *G01R 1/02* | (2006.01) |

(52) U.S. Cl.
CPC .......... *G01R 31/008* (2013.01); *G01R 31/50* (2020.01); *G01R 31/58* (2020.01); *G01R 1/025* (2013.01)

(58) Field of Classification Search
None
See application file for complete search history.

(56) References Cited

U.S. PATENT DOCUMENTS

| | | |
|---|---|---|
| 6,417,672 B1 | 7/2002 | Chong |
| 6,442,498 B1 | 8/2002 | Krigel |
| 6,507,998 B1 | 1/2003 | Lyford |
| 6,570,385 B1 | 5/2003 | Roberts |
| 6,828,796 B2 | 12/2004 | Vang |
| 6,856,138 B2 | 2/2005 | Bohley |
| 6,917,595 B2 | 7/2005 | Chang |
| 6,954,076 B2 | 10/2005 | Teich |
| 7,373,069 B2 | 5/2008 | Lazo |
| 7,414,410 B2 | 8/2008 | Pham |
| 7,728,605 B2 | 6/2010 | Gervais |
| 8,208,134 B1 | 6/2012 | Gunal |
| 8,988,099 B2 | 3/2015 | Hall |
| 2001/0052778 A1 | 12/2001 | Smith |

(Continued)

FOREIGN PATENT DOCUMENTS

CN  203054146  7/2013

OTHER PUBLICATIONS

No Author Included, Handheld Aircraft Wire Tester(HAWT)/Test Leads, JSWAG Newsletter, Fall 2013, 2 pages, vol. 5, Issue 4, JSWAG, No city or country indicated.

*Primary Examiner* — Abul Kalam
(74) *Attorney, Agent, or Firm* — Dennen IP Law, LLC

(57) ABSTRACT

A system of the present disclosure has a host testing device having a first wireless transceiver and having host testing device logic configured to transmit a test command via the first wireless transceiver. Additionally, the system has a remote testing device coupled to a system component. The remote testing device has a second wireless transceiver and remote testing device logic that receives the test command from the host testing device and executes the test command on the system component.

21 Claims, 24 Drawing Sheets

(56) References Cited

U.S. PATENT DOCUMENTS

| | | | |
|---|---|---|---|
| 2004/0066202 A1* | 4/2004 | Pereira | G01R 31/021 324/539 |
| 2006/0043976 A1* | 3/2006 | Gervais | G01R 31/021 324/508 |
| 2007/0001683 A1 | 6/2007 | Crigel | |
| 2007/0258484 A1 | 11/2007 | Tolaio | |
| 2010/0073007 A1 | 3/2010 | Gervais | |
| 2013/0101092 A1 | 4/2013 | Wahl | |
| 2013/0201316 A1 | 8/2013 | Binder | |

* cited by examiner

600

| | | | | | | |
|---|---|---|---|---|---|---|
| | T1000 CABLE NETLIST | | | | | |
| | | | | | | |
| | | | | | | 21-Jan-14 |
| | CABLE P/N | 2100000LT-3 | | | | |
| | TEST ID | OL1-3 | | User input data in blue shaded cells only | | |
| | CONTINUITY | 1 | Ohms | Be sure to follow all instructions for entering data | | |
| | ISOLATION | 100 | Kohms | Blue text is example data and can be deleted or overwritten | | |
| | | | | | | |
| | WIRE | TESTER PIN | CABLE PIN 1 | CABLE PIN 1 | TESTER PIN | CONTINUITY RESISTANCE | NOTES |
| | START OF WIRELIST | | | | | |
| 601 | W1 | T1-1 | H3-1 | J32-2 | T1-2 | | BLACK |
| | W2 | T1-3 | H3-2 | J23-1 | T1-4 | | WHITE |
| | W3 | T1-5 | H3-3 | J17-1 | T1-6 | | BLACK |
| | W4 | T1-7 | H3-4 | J17-2 | T1-8 | | RED |
| | W5 | T1-9 | H3-5 | J22-2 | T1-10 | | BLACK |
| | W6 | T1-11 | H3-6 | J22-1 | T1-12 | | WHITE |
| | W7 | T1-13 | H3-8 | J22-3 | T1-14 | | SHIELD |
| | W8 | T1-15 | | | T1-16 | | |
| | W9 | T1-17 | | | T1-18 | | |
| | W10 | T1-19 | | | T1-20 | | |
| | W11 | T1-21 | | | T1-22 | | |

| | | | | | | | |
|---|---|---|---|---|---|---|---|
| | T1000 CABLE NETLIST | | | | | | |
| | | | | | | | |
| | | | | | | | 21-Jan-14 |
| | CABLE P/N | 2100000LT-3 | | User input data in blue shaded cells only | | | |
| | TEST ID | 0L1-3 | | Be sure to follow all instructions for entering data | | | |
| | CONTINUITY | 1 | Ohms | Blue text is example data and can be deleted or overwritten | | | |
| | ISOLATION | 100 | Kohms | Red text is for instruction and can be deleted or overwritten | | | |
| | WIRE | TESTER PIN | CABLE PIN 1 | CABLE PIN 1 | TESTER PIN | CONTINUITY RESISTANCE | NOTES |
| | START OF WIRELIST | | 704 | 705 | | | |
| | W1 | T1-1 | H3-1 | J32-2 | T2-1 | | BLACK |
| | W2 | T1-2 | H3-2 | J23-1 | T2-2 | | WHITE |
| | W3 | T1-3 | H3-3 | J17-1 | T2-3 | | BLACK |
| | W4 | T1-4 | H3-4 | J17-2 | T2-4 | | RED |
| | W5 | T1-5 | H3-5 | J22-2 | T2-5 | | BLACK |
| | W6 | T1-6 | H3-6 | J22-1 | T2-6 | | WHITE |
| | W7 | T1-7 | H3-8 | J22-3 | T2-7 | | |
| | W8 | T1-8 | T1-T2 | | T2-8 | | |
| | W9 | T1-9 | CONNECTIONS | | T2-9 | | |
| | W10 | T1-10 | | | T2-10 | | |
| | W11 | T1-11 | | | T3-1 | | |
| | W12 | T1-12 | | | T3-2 | | |
| | W13 | T1-13 | | | T3-3 | | |
| | W14 | T1-14 | | | T3-4 | | |
| | W15 | T1-15 | T1-T3 | | T3-5 | | |
| | W16 | T1-16 | CONNECTIONS | | T3-6 | | |
| | W17 | T1-17 | | | T3-7 | | |
| | W18 | T1-18 | | | T3-8 | | |
| | W19 | T1-19 | | | T3-9 | | |
| | W20 | T1-20 | | | T3-10 | | |
| | W21 | T2-11 | | | T3-11 | | |
| | W22 | T2-12 | | | T3-12 | | |
| | W23 | T2-13 | | | T3-13 | | |
| | W24 | T2-14 | | | T3-14 | | |

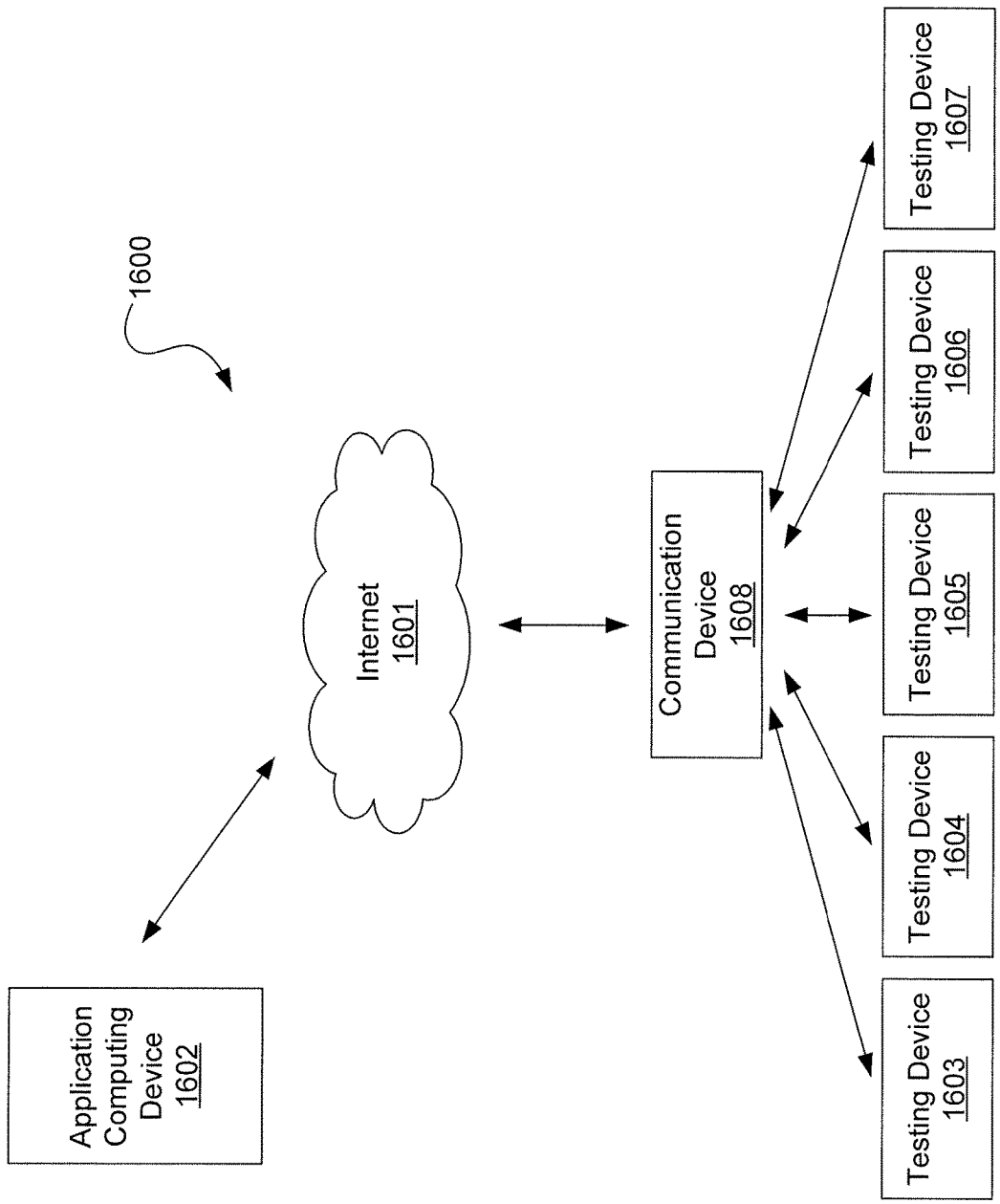

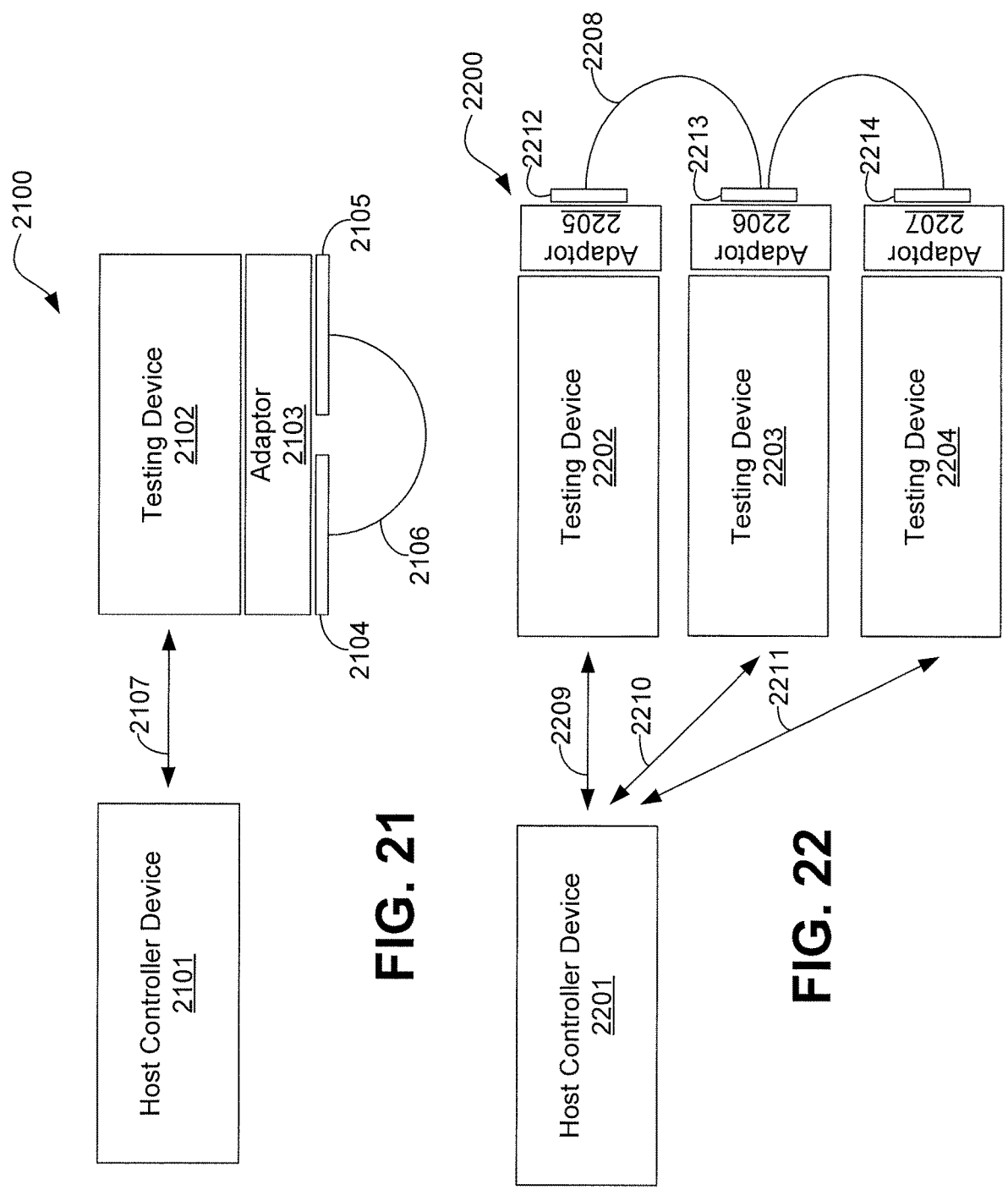

ns. The present disclosure can be better understood with reference to the following drawings. The elements of the drawings are not necessarily to scale relative to each other, emphasis instead being placed upon clearly illustrating the

TESTING SYSTEMS AND METHODS

CROSS-REFERENCE TO RELATED APPLICATIONS

This application claims priority to U.S. Provisional Patent Application Ser. No. 62/054,668 entitled Cable Testing Systems and Methods and filed on Sep. 24, 2014 and U.S. Provisional Patent Application Ser. No. 62/126,345 entitled System Component Testing Systems and Methods and filed on Feb. 27, 2015, both of which are incorporated herein by reference.

BACKGROUND

Installation and maintenance tasks typically require technicians to diagnose and/or locate a problem in a complicated system. The complicated system may comprise a myriad of electronics and components making up subsystems that have numerous interfaces to other electronics and components or other subsystems. In such a scenario, when a system is not operating or functioning properly, it is often difficult to locate the offending subsystem and/or electronics causing a fault in the system.

Where a technician is diagnosing issues with a system located "in the field," it is often the case that the technician does not have the necessary information he/she needs to diagnose the problem. In such a scenario, the technician may have to telephone a central office for additional information. In one scenario, the technician may carry with him/her physical documents describing the system to use for troubleshooting purposes. This is a laborious activity in that it would be undesirable for the technician to physically carry all documents that the technician may need in order to perform diagnosis and repair of the system.

SUMMARY

A system of the present disclosure has a host testing device having a first wireless transceiver and having host testing device logic configured to transmit a test command via the first wireless transceiver. Additionally, the system has a remote testing device coupled to a system component. The remote testing device has a second wireless transceiver and remote testing device logic that receives the test command from the host testing device and executes the test command on the system component.

BRIEF DESCRIPTION OF THE DRAWINGS

The present disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 6 is exemplary wiring data for a single testing device configuration for use by the host testing device depicted in FIG. 4.

FIG. 7 is exemplary wiring data for a multiple testing device configuration for use by the host testing device depicted in FIG. 4.

FIG. 16 is an exemplary system in accordance with an embodiment of the present disclosure.

FIG. 21 is a block diagram of a high-voltage insulation testing system using a single testing device in accordance with an embodiment of the present disclosure.

FIG. 22 is a block diagram of a high-voltage insulation testing system using multiple testing devices in accordance with an embodiment of the present disclosure.

DETAILED DESCRIPTION

Figure 1:
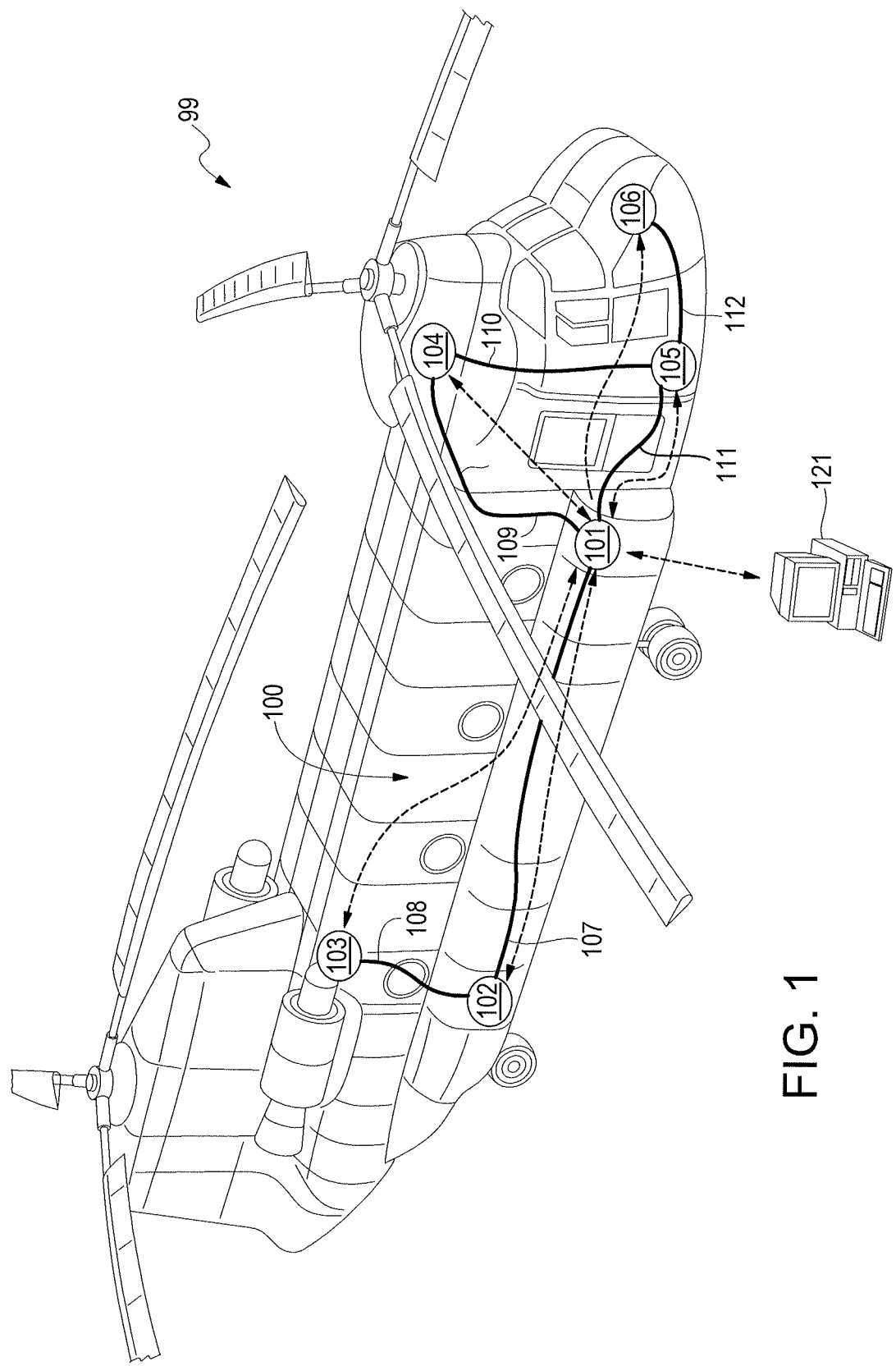
FIG. 1 depicts an exemplary testing system in accordance with an embodiment of the present disclosure interface with a CH47 helicopter.

The present disclosure describes testing apparatuses, systems, and methods configured for efficiently and effectively testing electronics, components, subsystems, and/or systems. Hereinafter in the present disclosure the term "system" may be read to mean electronics, components, and subsystems singularly or any combination thereof under test.

In one embodiment, a testing apparatus is a handheld device that comprises physical interfaces that couple the handheld device to the system. Additionally, the handheld device has an interactive touchscreen display device and/or a keyboard for receiving input from a technician using the handheld device.

In one embodiment, a testing system of the present disclosure comprises the handheld device contemplated hereinabove and a server computing device. In the embodiment, the handheld device comprises a wireless communication module that communicates with the server computing device. The server computing device may house electronic documents indicative of technical information, and through the wireless communication module, the handheld device may receive electronic documents that describe the system-under-test. Note that the technical information may be provided to the handheld device via other means, such as, for example, via a universal serial bus (USB) or Ethernet cable.

In one embodiment, the electronic documents retrieved may be interactive. In such an embodiment, the handheld device may query the technician about the system, subsystem, component or electronic device that is under test and receive input from the technician. In response to the input from the technician and measurements from the handheld device, the handheld device may display data indicative of additional queries, information, demonstrative statements, or the like that aid the technician in diagnosing, repairing, and/or retesting the system-under-test.

Additionally, in response to a test performed using the handheld device, the handheld device may retrieve technical information based upon the test performed. In one embodiment, the test performed may result in a fault indication. Based upon this fault indication, the handheld device may retrieve technical information, e.g., diagnostic, repair, or testing information, related to the particular error, that may be used by the handheld device and/or the operator to remedy the fault.

Note that there are numerous ways the handheld device may be used to test a variety of electronics, components, subsystems, and/or systems. In one embodiment, the handheld device may be used to test cables, cables harnesses, wire harnesses, cable assemblies, wiring assemblies or wiring looms, or the like. In regard to FIG. 1, which shall now be described, the handheld device is discussed in terms of testing cable harnesses. However, as noted, the handheld device may be used to test other electronics, components, subsystems and/or systems in other embodiments.

The following description describes handheld devices, systems, and methods in reference to interfacing and testing cables in a CH47 helicopter. This illustration is for exemplary purposes only, and the present disclosure is not so limited. In this regard, the handheld devices, systems, and methods contemplated by the present disclosure may be used to interface with a variety of electronics, components, subsystems, and/or systems.

FIG. 1 depicts an exemplary testing system 100 configured for testing and/or diagnosing a malfunction in cables in a CH47 helicopter 99 in accordance with an embodiment of the present disclosure. Note that the use of the CH47 helicopter is merely an example of a vehicle, device, apparatus, electrical equipment, etc. on which the testing system 100 may be installed. In this regard, the testing system 100 may be installed on any type of electrical device that comprises cables or other electronic equipment for electrically coupling and/or controlling various electrical components.

In the CH47 helicopter 99 there are numerous electrical devices (not shown) coupled together via cables and other electronic components. Oftentimes, a cable or a component fails and is no longer operating or is malfunctioning. However, it is difficult to test the cables or components to ascertain if the cable or component is inoperable or operating ineffectively. In this regard, there is an overabundance of cables connecting many electrical devices, and pinpointing a malfunction in a single cable is difficult and cumbersome.

The testing system 100 comprises a host testing device 101 and one or more remote testing devices 102-106. The host testing device 101 controls testing of the cables or other electronic components on the vehicle by communicating with the remote testing devices 102-106. The remote testing devices 102-106 receive and execute tests based upon commands issued from the host testing device 101. Commands from the host testing device 101 comprise data indicative of the operations that are to be executed by the remote testing devices on the cables or other electronic components.

The system further comprises a computing device 121. Note that the computing device 121 can be one of any desktop computer, server, tablet, handheld device, laptop computer, or any other type of device that could serve as a central processing apparatus.

The computing device 121 is communicatively coupled to the host testing device 101. In one embodiment, the computing device 121 wirelessly communicates with the host testing device 101. In the embodiment, the computing device 121 comprises a wireless transceiver (not shown) and the host testing device 101 also comprises a wireless transceiver (not shown). The computing device 121 wirelessly communicates with the host testing device 101, which is described further herein. In another embodiment, the computing device 121 may be physically coupled to the host testing device 101 via a cable, e.g., a universal serial bus (USB) cable.

In operation, data used in testing the system-under-test may be configured and/or generated by the computing device 121. As mere examples, wiring topology and test programs may be created or generated by a user of the computing device 121. Other types of data used in testing the system-under-test may be created and/or generated electronically by the computing device 121.

In one embodiment, a user of the computing device 121 creates a test program that comprises one or more instructions to be executed by the host testing device 101 or the remote testing devices 102-106. Exemplary instructions, which are described further herein, may include an instruction to ground a particular wire and measure a voltage related to another wire under test. Further, an instruction may comprise a calculation, e.g., calculating resistance in the wire being tested based upon the measurements taken, which is calculated by the host testing device 101 based upon the test program. Other types of instructions are possible in other embodiments. Further, additional reference is made herein regarding instructions contained in the test program for execution by the host testing device 101 and/or the remote testing devices 102-106.

The computing device 121 downloads data indicative of the test program created to the host testing device 101. In one embodiment, different test programs may be created for testing different parameters of the system under test. The parameters being tested may dictate the type of instrument to be used in the test. In this regard, the host testing device 101 is configured with a port, which is described further herein, for receiving a number of different adapters each having different types of hardware for performing a particular test. Thus, multiple test programs may be downloaded to the host testing device 101 wherein each of the test programs downloaded is configured to run a different test or use different hardware for running the test dictated by the test program.

Additionally, wiring topology of the system-under-test may be created on the computing device 121. In this regard, a user may manually create data, e.g., an excel spreadsheet, that describes the wiring topology of the system-under-test. After creation, data indicative of the wiring topology is downloaded to the host testing device 101. The host testing device 101 uses the data indicative of the wiring topology in running a test program. For example, based upon the wiring topology, the host testing device 101 may direct one of the remote testing devices 102-106 to ground a particular wire as identified in the wiring topology. Note that an excel format is an exemplary format for the wiring topology. Other formats for the wiring topology data may be used in other embodiments. Exemplary data files for mapping wiring topology are further described with reference to FIGS. 6 and 7.

Note that a cable in the CH47 (and in other vehicles) couples one device to another device. That point on the cable at which a testing device couples to the cable is hereinafter referred to as the "coupling end." Thus, the host testing device 101 and the remote testing devices 102-106 may be connected at the coupling ends of cables (not shown) that connect the various electrical components on the CH47 helicopter 99 for the purpose of testing the operational status of the cables, i.e., to determine if the cables are malfunctioning.

As indicated hereinabove, the testing system 100 may be used to test cables or other electronic components on the CH47 helicopter 99 shown in FIG. 1. For purposes of illustration and clarity, the following disclosure is described with reference to the testing of cables; however, similar testing may be performed as described on other electronic components.

As indicated hereinabove, the host testing device 101 controls testing of the system-under-test based upon a test program. As described hereinabove, one or more test programs are downloaded to the host testing device 101. When a number of test programs are resident on the host testing device 101, the host testing device 101 may display a list of the plurality of test programs to a display device (described with reference to FIG. 4). A user of the host testing device 101 may then select one of the test programs from the listed test programs for execution to test the system-under-test. Based upon information contained in the test program selected on the host testing device 101, the host testing device 101 transmits data indicative of commands and/or instructions to the remote testing devices 102-105. Additionally, the host testing device 101 may execute commands on the host testing device 101. In response to receiving data indicative of commands and/or instructions, the remote testing devices 102-106 execute the commands and/or instructions.

Note that prior to selection of a test program on the host testing device 101, the host testing device 101 and remote testing devices 102-106 are identical in hardware, software, and functionality. It isn't until a test program is selected on the host testing device 101 that it becomes the test controller of the system 100. Thus, prior to selecting the test program on the host testing device 101, any of the testing devices 101-106 may be used as the controller of the system 100. However, once the test program is selected on the host testing device 101, it becomes the controller of the system 100. Accordingly, any of the testing devices 101-106 may store data indicative of test programs and store and display results from a test run by the system 100. In light of the foregoing, the system 100 does not require a separate or central controller.

With respect to the system 100, each testing device 101-106 is installed on a coupling end of a cable prior to testing. Notably, adapter cables (shown in FIGS. 2 and 3) are used to interface each testing device 101-106 with a coupling end of a cable that typically couples to an electrical device for power or signaling.

As was described hereinabove, each of the testing devices 101-106 is configured with particular hardware such that each can operate as either a host testing device or a remote testing device, as described hereinabove. However, with respect to FIG. 1 and for exemplary purposes the particular configuration shows that the host testing device is host testing device 101, and the remote testing devices are remote testing devices 102-106. In this regard, an installer (not shown) has selected host testing device 101 to be the controller by selecting a test program being stored on the host testing device 101, which was previously downloaded to the host testing device 101.

In another embodiment, upon installation the installer may choose to make testing device 102 the host testing device, then an appropriate test program would be loaded onto the testing device 102. When a user of the testing device 102 selects the test program downloaded to the testing device 102, the testing device 102 becomes the host testing device. In such an embodiment, the host testing device 101 would therefore operate as a remote testing device executing commands and/or instructions received by the host testing device 101 from the testing device 102. Which testing device 101-106 is selected as the host testing device does not affect operation of the system 100.

In the embodiment being described, each of the testing devices 101-106 of the system 100 interfaces with a coupling end of a wire harness that contains cables-under-test. A wiring harness 107 couples host testing device 101 to remote testing device 102, a wiring harness 108 couples remote testing device 102 with remote testing device 103, wiring harness 109 couples host testing device 101 with remote testing device 104, and wiring harness 111 couples host testing device 101 with remote testing device 105. Additionally, wiring harness 110 couples remote testing device 105 with remote testing device 104, and wiring harness 112 couples remote testing device 105 with remote testing device 106. Coupling of the wiring harnesses 107-112 to the testing devices 101-106 is effectuated using adapter cables (not shown but discussed further herein) that connect each testing device 101-106 to the respective cables-under-test coupling-end contained within the wiring harnesses 107-112.

Note that in some embodiments, each of the cables-under-test comprises a plurality of wires. During operation, the testing system 100 is configured to test electrical paths created by these wires that are within the wiring harnesses 107-112. The tests executed are configured to test the electrical paths of the wires to determine if there are any inoperable or malfunctioning wires in the wiring harnesses 107-112 or if there are any wires that have been connected incorrectly as related to a wiring topology, as described hereinabove, of the testing system 100. A more detailed description of such methods is provided more fully herein.

In one embodiment, each of the testing devices 101-106 is configured for communicating wirelessly. Thus, a wireless communication path exists between the host testing device 101 and each of the remote testing devices 102-106. The wireless communication path allows the host testing device 101 to send testing commands and/or instructions to each of the remote testing devices 102-106.

Once the host test device 101 and the remote testing devices 102-106 have been connected to respective coupling ends of the wire harnesses 107-112, the installer activates the host testing device 101. In response to activation, the host testing device 101 broadcasts a message wirelessly to each remote testing device 102-106 requesting a response. In response to receiving the broadcast message, each remote testing device 102-106 transmits data indicative of a response, and at least a portion of the data transmitted includes a unique identifier. The transmitted data indicative of the unique identifier uniquely identifies the remote testing device 102-106 that transmits the data.

In one embodiment, the data indicative of the unique identifier that the host testing device 101 receives from each remote testing device 102-106 is used to identify each particular remote testing device 102-106, and the host testing device 101 displays for viewing each identifier. The installer then determines which remote testing device 102-104 is connected to which coupling-end, i.e., the connector to which the remote testing device 102-104 is coupled.

Figure 2:
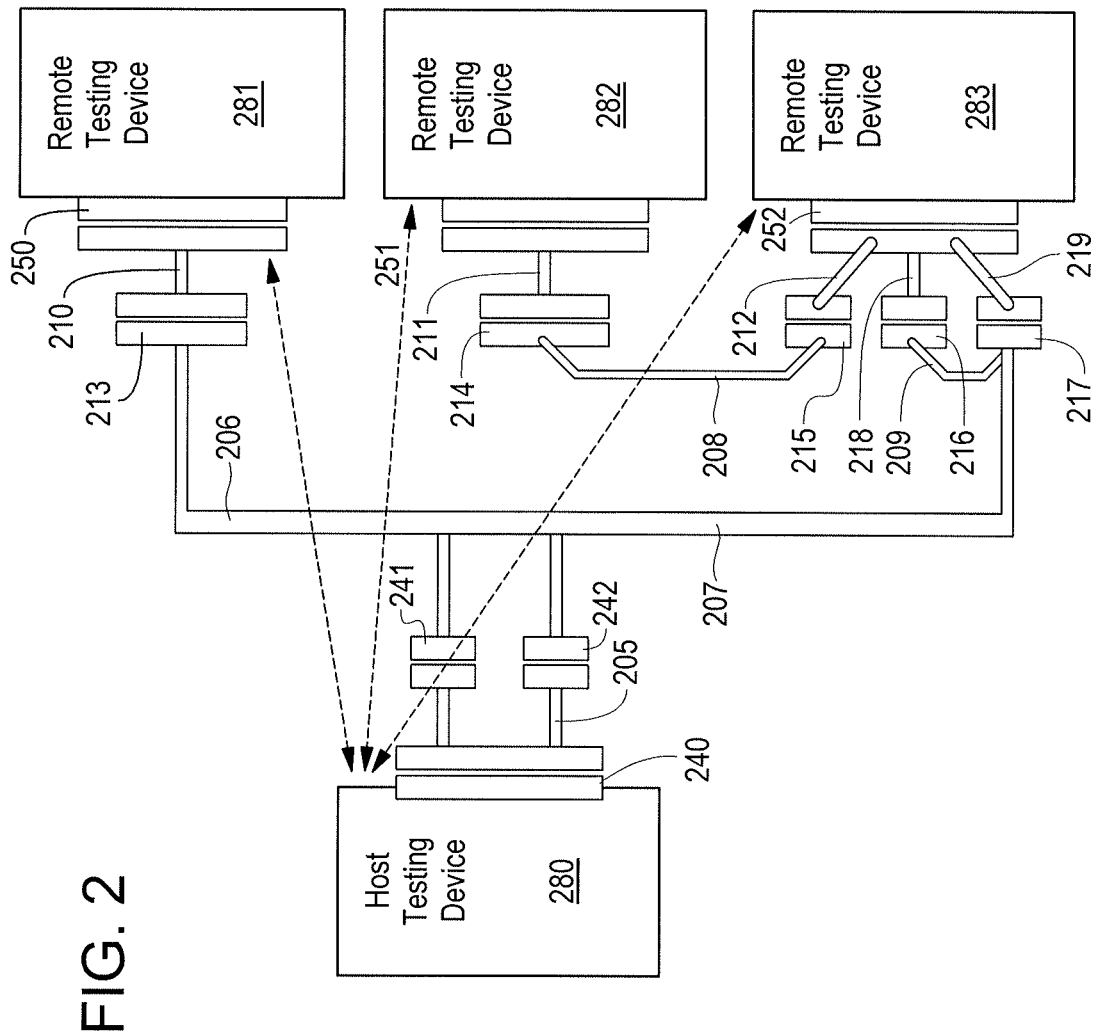
FIG. 2 is a block diagram of another exemplary testing system in accordance with an embodiment of the present disclosure.

FIG. 2 is a block diagram of an exemplary test system 200 using four testing devices 280-283 in accordance with an embodiment of the present disclosure. Note that the handheld devices described hereinabove are hereinafter referenced as "testing devices." Initially the testing devices 280-283 are substantially identical in hardware, software, and functionality, as noted hereinabove. However, when data indicative of a test program is selected by an installer (not shown), the handheld device for which the test program is selected becomes a host testing device.

In the exemplary testing system 200 depicted in FIG. 2, data indicative of a test program has been loaded onto testing device 280 thereby identifying it as the host testing device 280. The remaining three testing devices 281-283, referred to as remote testing devices 281-283, do not contain the data indicative of the test program; however, each does execute commands and/or instructions based upon data received from the host testing device 280, which is contained in the test program.

FIG. 2 shows an exemplary setup of the testing devices 280-283. Notably, the cables-under-test include cable 206, cable 208, and cable 209. In the description hereafter, reference is made to adapter cables. In accordance with the present disclosure, the term "adapter cable" includes two connectors and a cable. The cable is coupled at a first end to a testing device connector and coupled at a second end to a cable connector. The testing device connector connects to a testing device, e.g., a host testing device or a remote testing device. The cable connector connects to a cable-under test. In one embodiment, the testing device comprises a 128-pin connector that couples to electronics in the testing device, and the testing device connector is a complementary 128-pin connector that mates with the connector on the testing device. In another embodiment, the testing device may comprise an electronics device that couples to the testing device via a series of electrical contacts. In such an embodiment, the adapter cable would couple to the electronics device. Further, the electronics device may enable additional functionality, including hardware and logic that allows the testing device to perform a variety of different tests.

In regards to FIG. 2, the host testing device 280 is connected through an adapter cable 205 to the cable-under-test 206. The cable-under-test 206 is adapted to the remote testing devices 281 and 283.

The adapter cable 205 adapts a connector 240 on the host testing device 101 to the connectors 241, 242 that are coupled to the cable-under-test 206. Likewise, adapter cable 210 connects the cable-under-test 206 with the remote testing device 281 through a connector 213 and a connector 250, and adapter cable 219 connects the cable-under-test 206 with the remote testing device 283 through a connector 217 and a connector 252.

Note that the system 200 is further configured to test cables that are not necessarily directly electrically coupled to the host testing device 101. In the exemplary system 200, the cable 208 and the cable 209 are not directly electrically coupled to the host testing device 101. In this regard, adapter cable 211 connects remote testing device 282 with the cable-under-test 208 through a connector 214 and a connector 251, and adapter cable 212 connects remote testing device 283 with the cable-under-test 208 through a connector 215 and the connector 252. Further, cable-under-test 209 connects with remote testing device 283 via adapter cables 218 and 219 through connectors 216 and 217 and the connector 252. Note that cable-under-test 209 originates and terminates with remote testing device 283. In such an embodiment, the remote testing device 283 by itself may be used to test the cable-under-test 209 at the direction of the host testing device 280.

As described in the present embodiment, the testing devices 280-283 may comprise 128-pin connectors that interface each testing device 280-283 with respective adapter cables 205, 210, 211, and 212. Note that as will be shown further herein, the testing devices 280-283 may comprise an adapter module (not shown) that couples to the testing devices 280-283. In such an embodiment, the adapter module is removable. Thus, instead of providing 128-pin connectors for interfacing with the cables 206-209, in one embodiment, the testing device may comprise a plurality of spring contacts, and the adapter module may comprise a plurality of corresponding mating target areas that establish an electrical connection when in contact with the spring contacts between the adaptor module and the testing device. In this regard, the spring contacts provide connections with the adapter of the system 200. The adapter cable utilizing spring contacts may connect to a plurality of different adaptors having different coupler ends. Further, the spring contact adapter provides a more reliable connection than the 128-pin type adapter module that it can replace. In such an embodiment, the spring contact adapter module may comprise a printed-circuit-board with target metalized areas for connection to the spring contacts.

The testing architecture and methods of testing the cables-under-test are described more fully herein. Notably, however, the host testing device 280 directs the remote testing devices 281-283 to perform operations during execution of a test program. The host testing device 280 takes measurements based upon the operations executed by the remote testing devices 281-283 to ensure that the cables-under-test 206-209 are connected correctly, operating, and operating properly. Additionally, the remote testing devices 281-283 may also take measurements where the remote testing devices 281-283 are not directly connected to the host testing device 280. In such a scenario, the remote testing devices 281-283 may take measurements and transmit data indicative of the measurements to the host testing device 280.

In response to measurements taken and measurements received from remote testing devices 281-283, the host testing device 280 performs calculations and determines pass/fail results. The host testing device 280 stores data indicative of measurements taken and received in nonvolatile memory for the installer (not shown) to view.

Figure 3:
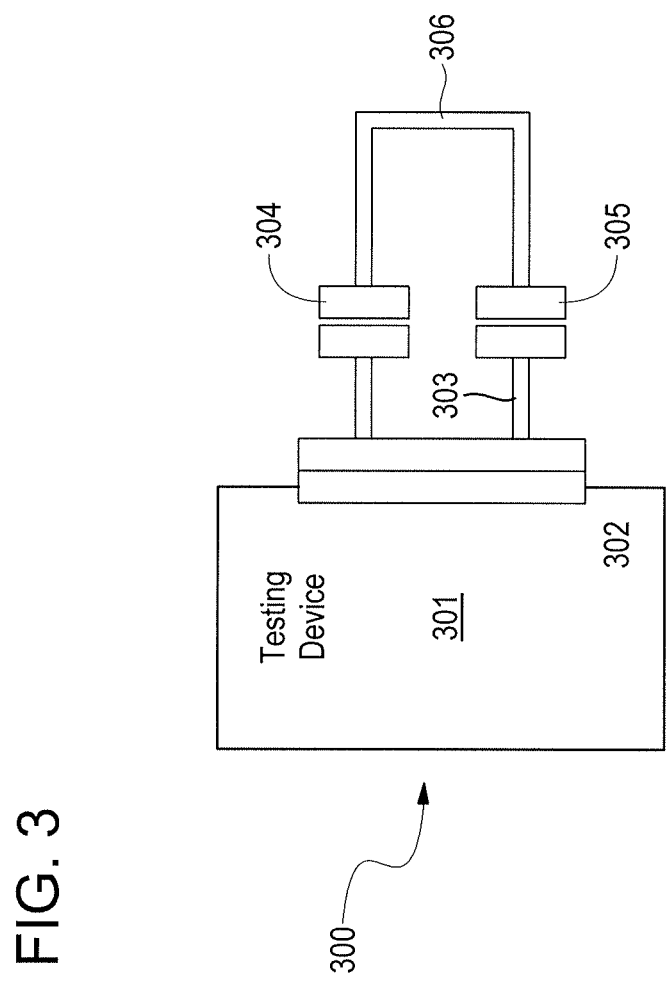
FIG. 3 is a block diagram of a single testing device configuration in accordance with an embodiment of the present disclosure.

FIG. 3 depicts a system 300 that is configured for testing a cable 306 wherein the system 300 only has a single testing device 301. Thus, in one embodiment a testing device 301 in accordance with an embodiment of the present disclosure has standalone test capabilities. In such an embodiment, an adapter cable 303 couples a connector 302 to the connectors 304, 305 of the cable 306. Through a series of operations and measurement, the testing device 301 determines that the cable 306 is connected properly and operating properly. The architecture and method for testing the cable 306 is described more fully herein.

Figure 4:
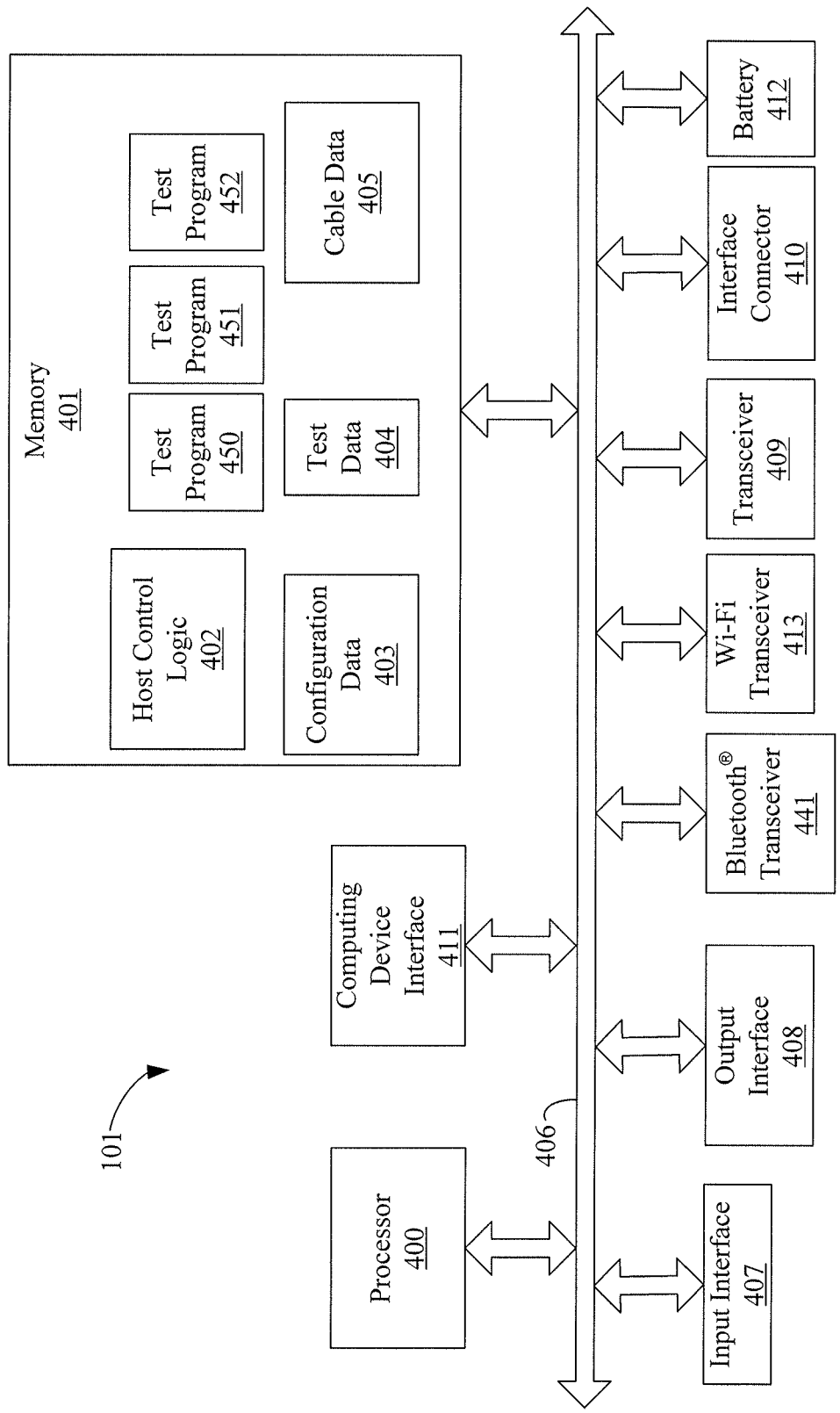
FIG. 4 is a block diagram of a host testing device such as is depicted in FIG. 1.

FIG. 4 depicts an exemplary host testing device 101 such as is depicted in FIG. 1. The exemplary host testing device 101 generally comprises processor 400, output interface 408, input interface 407, a wireless local area network (WLAN) Wi-Fi transceiver 413, transceiver 409, a Bluetooth® transceiver, and a cable interface connector 410. Each of these components communicates over local interface 406, which can include one or more buses.

The host testing device 101 further comprises host control logic 402, configuration data 403, test data 404, and cable data 405. Control logic 402 can be software, hardware, or a combination thereof. In the exemplary host testing device 101 shown in FIG. 4, host control logic 402 is software stored in memory 401. Memory 401 may be of any type of memory known in the art, including, but not limited to random access memory (RAM), read-only memory (ROM), flash memory, and the like.

As noted hereinabove, control logic 402, configuration data 403, test data 404, and cable data 405 are shown in FIG. 4 as stored in memory 401. When stored in memory 401, control logic 402, configuration data 403, test data 404, and cable data 405 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions.

In the context of the present disclosure, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

Processor 400 may be a digital processor or other type of circuitry configured to run the control logic 402 by processing and executing the instructions of the control logic 402. Further, the processor 400 communicates with and drives the other elements within the host testing device 101 via the local interface 406.

In addition, the transceiver 409 may be, for example, a low-powered radio device, e.g., a radio semiconductor, radio frequency antenna (RF antenna) or other type of communication device, which communicatively couples the host testing device 101 with the remote testing devices 102-106 (FIG. 1). In one embodiment, the transceiver 409 is a wireless transceiver that is configured to transmit and receive messages wirelessly from the remote testing devices 102-106. In this regard, the control logic 402 may communicate bi-directionally via the transceiver with each remote testing device 102-106.

The Wi-Fi transceiver 413 is any type of transceiver that allows the host test device 101 to communicate with a computer network (not shown). As an example, the Wi-Fi transceiver 413 allows the host test device 101 to transmit and receive data via the Internet.

The host testing device 101 further comprises the Bluetooth® transceiver 441. The Bluetooth® transceiver 441 enables the host testing device 101 to communicate short-range with cellular phones, computers, or other electronic devices.

The output interface 408 is any type of device for providing information to a user, e.g., an installer of the system 100. In this regard, the output interface may be, for example, a backlit liquid crystal display (LCD) screen (not shown), which is touch-sensitive for operation with a stylus (not shown). Other types of output interfaces 308 may be, for example, an audio device that provides instructions to the installer audibly, light emitting diodes (LED) that show status of the host testing device, or any other type of output interface that provides sensory information to the installer. While some examples have been given, other types of output interfaces may be used in other embodiments of the present disclosure.

The input interface 407 is any device that enables the installer to input data into the host testing device 101. In one embodiment, the input interface 407 is a touchscreen that allows the user to provide information to the host testing device 101 by selecting areas on the touch screen. In another embodiment, the input interface may be, for example, a keyboard or a microphone. In this regard, the installer may use the keyboard to type data into the host testing devices. While some examples have been given, other types of input interfaces may be used in other embodiments of the present disclosure.

Note that the output interface 408 and input interface 407 may be combined into a touchscreen device (not shown). In such an embodiment, an installer may use the touchscreen to select a test to be run and review test results. Additionally, the user may view and set tester configurations, e.g., radio settings, display brightness, monitor battery charge, status, etc. Further, as will be described with reference to FIG. 16, the installer may also connect to a computer over the Internet or other network to upload and download data, such as test programs, test results, or processor memory contents. Additionally, the installer may view images, diagrams, documentation, instructions or other data that is either resident in memory 401 or is downloaded from a computer via a network, as described with reference to FIG. 16.

The host testing device 101 further comprises an interface connector 410. The interface connector 410 is any type of connector that couples the host testing device 101 to an electronic device, such as, for example a cable. In one embodiment, the interface connector 410 may be a 128-pin connector that couples to, for example, an adapter cable as described with reference to FIG. 2. In another embodiment, the interface connector may be a set of spring contacts that allows an electronic device or smart adapter to be interfaced with the host testing device 101.

Configuration data 403 is any type of data that defines the operation or testing of the system 100. In this regard, the configuration data 403 may comprise data indicative of test limits and harness wire connectivity. Notably, a test executed by the testing device 101 may determine if a wire is connected correctly and not connected to any other path.

Thus, the configuration data 403 may comprise data indicative of continuity limits, e.g., 1 Ohm, and isolation limits, e.g., 100 KOhm. In a particular test commanded by the host testing device 101, resistance may be measured and compared with the continuity limit. If the measurement is less than the continuity limit, then the cable-under-test for the particular connection is operating properly. Other configuration data 403 may be data indicative of isolation limits. An isolation limit is the resistance between one wire and all other wires. In such an example, the host testing device 101, measures the resistance between the wire being tested and all the other wires in a cable harness. If the resistance measured is greater than the isolation limit, there is no connection. The data indicative of the isolation limit may be for example an isolation limit of 100 k$\Omega$. Other types of configuration data 403 may be a cable part number identifying the cable-under-test or a test identifier that identifies the tests being run on the cable-under-test.

Test data 404 is any data indicative of test results performed on a component being tested by the host testing device 101. As an example, the test data 404 may comprise data indicative of the results of the test of the cables-under test, as described with reference to FIG. 2. In this regard, the test data 404 may comprise data indicating that a particular wire was tested and the outcome of the test correlated with the wire tested.

Cable data 405 is data that describes the testing configuration of the cables-under-test. Exemplary cable data 405 is shown and depicted in FIGS. 6 and 7. Notably, in one embodiment, the cable data 405 is generated on a computing device 121 (FIG. 1) in a computer and human readable format, such as, for example Excel®. The cable data 405 is downloaded to the host testing device 101 through a computing device interface 411, which can be, for example, a universal serial bus (USB) port, and Ethernet connection, or any type of interface that allows information to be transferred from the computing device 121 to the host testing device 101.

Further, the memory 401 may store data indicative of test programs 450-452. As identified hereinabove, test programs are downloaded to the host testing device 101 from a computing device 121 (FIG. 1). These test programs 450-452 comprise data indicative of commands and/or instructions to be carried out by the host testing device 101 and the remote testing devices 102-106 (FIG. 1) during testing. In one embodiment, the host control logic 402 may display a listing of the test programs 450-452 to the output interface 408. An installer (not shown) can select from the list which test program to execute, and once selected, the host testing device 101 is the controller of the test.

Note that the host testing device 101 further comprises a battery 412. The battery 412 provides power to the host testing device 101. The battery 412 is an exemplary power source. In other embodiments, the host testing device 101 may be powered by a universal serial bus (USB) connected to a computer or an alternating current (A/C) adapter. Furthermore, the battery 412 may be charged by the USB or the A/C adapter (not shown).

The host testing device 101 depicted in FIG. 4 may be used as a single testing device in the configuration depicted in FIG. 3 (testing device 301). In such an embodiment, the host control logic 402 comprises all logic necessary to test the cable 306 (FIG. 3). As noted hereinabove, the host control logic 402 may comprise hardware, software, and/or firmware for controlling the testing of the cable 306.

Figure 5:
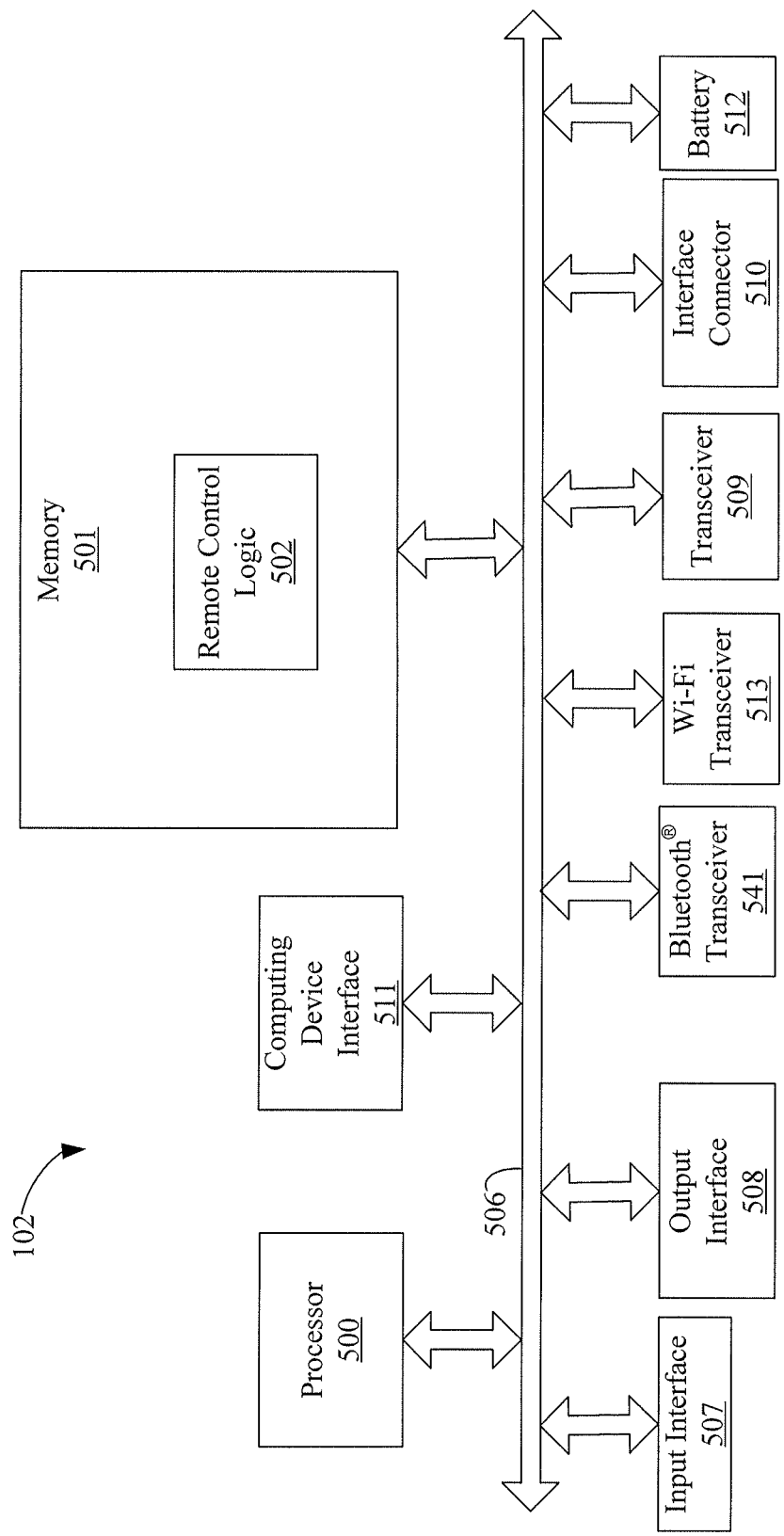
FIG. 5 is a block diagram of a remote testing device such as is depicted in FIG. 1.

FIG. 5 depicts an exemplary remote testing device 101 such as is depicted in FIG. 1. The exemplary remote testing device 102 generally comprises processor 500, output interface 508, input interface 507, wireless local area network (WLAN) Wi-Fi transceiver 513, transceiver 509, a Bluetooth® transceiver, and a cable interface connector 519. Each of these components communicates over local interface 506, which can include one or more buses.

The remote testing device 102 further comprises remote control logic 502, although the remote testing device 102 may be operated as a host device, if a test program is transmitted to the remote testing device 102 as opposed to any other testing device. Control logic 502 can be software, hardware, or a combination thereof. In the exemplary remote testing device 102 shown in FIG. 5, control logic 502 is software stored in memory 501. Memory 501 may be of any type of memory known in the art, including, but not limited to random access memory (RAM), read-only memory (ROM), flash memory, and the like.

As noted hereinabove, control logic 502 is shown in FIG. 5 as software stored in memory 501. When stored in memory 501, control logic 502 can be stored and transported on any computer-readable medium for use by or in connection with an instruction execution system, apparatus, or device, such as a computer-based system, processor-containing system, or other system that can fetch the instructions from the instruction execution system, apparatus, or device and execute the instructions.

In the context of the present disclosure, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

Processor 500 may be a digital processor or other type of circuitry configured to run the control logic 502 by processing and executing the instructions of the control logic 502. Further, the processor 500 communicates with and drives the other elements within the remote testing device 102 via the local interface 506.

In addition, the transceiver 509 may be, for example, a low-powered radio device, e.g., a radio semiconductor, radio frequency antenna (RF antenna) or other type of communication device, which communicatively couples the remote testing device 102 with the host testing device 101 (FIG. 4) while executing a harness test. In one embodiment, the transceiver 509 is a wireless transceiver that is configured to transmit and receive messages wirelessly from the host testing device 101. In this regard, the control logic 502 may communicate bi-directionally via the transceiver with the remote testing devices 102-106 or the host testing device 101.

The Wi-Fi transceiver 513 is any type of transceiver that allows the host test device 101 to communicate with a computer network. For example, the transceiver 413 enables the remote testing device 102 to communicate with the Internet.

The remote testing device 102 further comprises the Bluetooth® transceiver 541. The Bluetooth® transceiver 541 enables the remote testing device 102 to communicate short-range with cellular phones, computers, or other electronic devices.

The output interface 508 is any type of device for providing information to a user, e.g., an installer of the system 100. In this regard, the output interface may be, for example, a backlit liquid crystal display (LCD) screen (not shown), which is touch-sensitive for operation with a stylus (not shown). Other types of output interfaces 508 may be, for example, an audio device that provides instructions to the installer audibly, light emitting diodes (LED) that show status of the host testing device, or any other type of output interface that provides sensory information to the installer. While some examples have been given, other types of output interfaces may be used in other embodiments of the present disclosure.

The input interface 507 is any device that enables the installer to input data into the remote testing device 102. In one embodiment, the input interface 507 is a touchscreen that allows the user to provide information to the remote testing device 101 by selecting areas on the touch screen. In another embodiment, the input interface may be, for example, a keyboard or a microphone. In this regard, the installer may use the keyboard to type data into the host testing devices. While some examples have been given, other types of input interfaces may be used in other embodiments of the present disclosure.

The remote testing device 102 comprises the interface connector 510. In one embodiment, the interface connector 510 may be, for example, a 128-pin connector that may be used to couple the remote testing device 102 with a wire harness. However, the interface connector 510 may also comprise a smart adapter with spring contacts, which is described herein.

Note that configuration data, test data, cable data, and test programs are not shown on the remote testing device 102. In this regard, only the testing device to which the test programs 450-452 (FIG. 4) is transmitted will be the host testing device, and such data is not resident on the remote testing device 102. Note, however, that if a test program 450-452 is loaded onto the remote testing device 102, and selected by an installer, it can behave as the host. In the example provided, it is assumed that remote testing device 102 is a remote testing device that receives testing commands and/or instructions from the host testing device 101.

Note that the remote testing device 102 further comprises a battery 512. The battery 512 provides power to the remote testing device 102. The battery 512 is an exemplary power source. In other embodiments, the remote testing device 101 may be powered by a universal serial bus (USB) connected to a computer or an alternating current (A/C) adapter. Furthermore, the battery 512 may be charged by the USB or the A/C adapter (not shown).

FIG. 6 depicts an excel spreadsheet 600 that is created by an installer to define the cable-under-test and the topology of connections. The spreadsheet 600 defines connections where there is but a single testing device such as is depicted in FIG. 3. In this regard, the spreadsheet 600 defines the cable data 405 (FIG. 4) that is downloaded to the testing device 301 (FIG. 3). Note that the spreadsheet 600 comprises cable data 405 for a system 300 (FIG. 3) for a single tester configuration.

The spreadsheet comprises a column 601 of wire identifiers. These wire identifiers define the wires within the cable-under-test. In this regard, there are wire identifiers W1 through W11 indicating there are eleven (11) wires in the cable-under-test.

Columns 602 and 603 identify the testing device (in the example provided is "T1") and pins on the testing device 301 (FIG. 3) of the connector 302 (FIG. 3). In regards to row "W1," the identifier "T1" identifies the testing device 301, and the number following, i.e., "T1-1," identifies the pin of the testing device, i.e., pin 1. Likewise, in column 603 on row "W1," the identifier "T1" identifies the testing device 301, and the number following, i.e., "T1-2," identifies the pin of the testing device, i.e., pin 2. Thus, a first end of wire 1 is connected to pin 1 of the testing device 301 and the terminating end of wire 1 is connected to pin 2 of the testing device 301.

Columns 604 and 605 identify pins on the connectors 304 and 305 that connect the adapter cables to the coupling-ends of the cable-under-test. In this regard, the "H3-1" identifies a specific pin on connector 304, and the "J32-2" identifies a specific pin on connector 305.

Accordingly, analyzing "W1" across the row, the data entered defines an entire wire connection. In this regard, "W1" of the cable-under-test is connected to H3-1 of the connector 304 and the other end of the wire is connected to J32-2 of connector 305. Additionally, through the adapter cable 303, pin H3-1 is connected to T1-1, and pin J32-2 is connected to pin T1-2. Thus, a connected electrical loop is defined in the spreadsheet 600. The remaining electrical connections are further defined in the following rows.

In addition to the wiring data as described, the configuration data 403 (FIG. 4) may also be included in the spreadsheet 600. As an example, a test identifier, continuity limits, isolation limits, and/or a part number of the cable-under-test. Further, while there may be a global continuity test limit defined in the spreadsheet, there may also be individual circuit continuity limits included per row in the "Continuity Resistance" column 606.

As described hereinabove, the installer manually generates the spreadsheet 600 on a computing device 121 (FIG. 1) defining the connections for the system comprising cables-under-test. Data indicative of the spreadsheet 600 is then transmitted to the testing device, e.g., the host testing device 101, through the computing device interface 411 (FIG. 4) from the computing device 121.

As indicated hereinabove with respect to FIGS. 3 and 4, the testing device 101 in FIG. 4, may be used as a single testing device in the configuration depicted in FIG. 3. The data indicated in the spreadsheet 600 comprises data describing the wiring topology for a single testing device configuration, as indicated hereinabove. In operation, the control logic 402 (FIG. 4) performs all operations for testing a cable.

In this regard, once the wiring topology data indicated in the spreadsheet 600 is downloaded to a testing device, e.g., the host testing device 101 (FIG. 4), and stored as cable data 405, the control logic 402 uses the data to execute one of the test programs 450-452 selected by the installer. As an example, if the test program 450-452 comprises a command that instructs the control logic 402 to ground a particular wire, the control logic 402 parses the control data 405 to identify the connector and pin associated with the particular wire. To further the example, if the command instructs the control logic 402 to ground the wire identified as W1, the control logic 402 locates W1 in the cable data 405. The control logic 402 then cross-references the W1 identifier as shown in column 601 and further identifies connector/pin H3-1 and connector pin J32-2. In response, the control logic 402 grounds pin 1 of connector H3 and pin 2 of connector J32 to perform the test indicated by the test program 450-452. FIG. 7 depicts an excel spreadsheet 700 that is created by an installer to define the cables-under-test and the topology of connections. The spreadsheet 700 depicted in FIG. 7 differs from spreadsheet 600 in that there are three testing devices designated as "T1," "T2," and "T3" as opposed to only a single testing device. Note that hereinabove the testing devices are referred to as host testing devices or remote testing devices. For simplicity of explanation of the wire topology, the terms "testing device" and "T1," T2," and "T3" are used in the following description. However, note that one of the three testing devices is a host testing device, and the remaining two testing devices are remote testing devices.

The spreadsheet 700 defines the cable data 405 (FIG. 4) that is downloaded to the host testing device 101 (FIG. 1) from the computing device 121. Note that the spreadsheet 700 comprises cable data 405 for a system having a multiple testing device configuration as opposed to a single tester configuration as described with reference to FIG. 6.

The spreadsheet comprises a column 701 of wire identifiers. These wire identifiers define the wires within the cable-under-test. In this regard, there are wire identifiers W1 through W24 indicating there are twenty-four (24) wires in the cable-under-test.

Columns 702 and 703 identify pins on the connector of the testing devices "T1," "T2," and "T3." Note that the testing devices are indicated via identifiers "T1," "T2," and "T3," and the number following, e.g., T1-1, identifies the pin of the testing device, i.e., pin 1. Furthermore, in the topology defined in spreadsheet 700 there are three testing devices as indicated by the "T1," "T2," and "T3" identifiers.

Columns 704 and 705 identify pins on the adapter connectors. In this regard, the "H3-1" identifies a specific pin on an adapter connector ("H3") connected to "T1," and the "J32-2" identifies pin 2 on the adapter connector ("J32") connected to "T2" at the coupler ends.

Accordingly, analyzing "W1" across the row, the data entered defines an entire wire connection. Wire one originates and is connected at "T1-1" of the testing device connecter, which is then connected to "H3-1" of the adapter connector. Wire one is then connected to "J32-2," which is connected to "T2-1." Thus, a connected electrical loop is defined in the spreadsheet 700 for a wire W1 that is connected to tester "T1" and tester "T2." The remaining electrical connections are further defined in the following rows.

As described hereinabove, the installer manually generates the data 700 on the computing device 121 (FIG. 1) defining the connections for the system comprising cables-under-test. Data indicative of the spreadsheet 700 is transmitted to the testing device, e.g., the host testing device 101, through the computing device interface 411 (FIG. 4) from the computing device 121. The data 700 is received from the computing device 121 and stored as cable data 405 (FIG. 4).

FIG. 2 depicts a configuration for which data 700 may be used in testing the cable-under-test. However, in the data 700 there are only three testing devices indicated as opposed to three testing devices indicated in FIG. 2. For exemplary purposes, use of the data 700 in performing tests on the configuration in FIG. 2 is described.

As indicated hereinabove with respect to FIGS. 2 and 4, the testing device 101 in FIG. 4, may be used with multiple remote testing device 281-283. The data 700 comprises data describing the wiring topology for a configuration wherein there are multiple remote testing devices, T1, T2, and T3. For purposes of illustration, T1 will refer to the host testing device 280 and T2 and T3 will refer to remote testing device 282 NS 283.

In this regard, once the wiring topology data 700 is downloaded to a testing device, e.g., the host testing device 101 (FIG. 4), and stored as cable data 405, the control logic 402 uses the data to execute one of the test programs 450-452 selected by the installer. As an example, if the test program 450-452 comprises a command that instructs the control logic 402 to ground a particular wire, the control logic 402 parses the control data 405 to identify the connector and pin associated with the particular wire. To further the example, if the command instructs the control logic 402 to ground the wire identified as W1, the control logic 402 locates W1 in the cable data 405. The control logic 402 then cross-references the W1 identifier as shown in column 701 and further identifies the remote testing device T1, i.e., host testing device 280 (FIG. 2), with the connector/pin H3-1 and remote testing device T2, i.e., remote testing device 282, with the connector pin J32-2. In response, the control logic 402 grounds pin 1 of connector H3 and pin 2 of connector J32 to perform the test indicated by the test program 450-452.

Note that there are multiple testing devices and multiple cables under test as described with reference to FIG. 2 and FIG. 7. In one embodiment, the host control logic 402 may test a single cable in the configuration shown in FIG. 2 between two of the testing devices. This may be referred to a "partial test." As an example, the installer may desire to test only cable 206 that connects the host testing device 280 to the remote testing device 283.

During a partial test, the control logic 402 displays to the installer a list of testing devices in the configuration. The installer selects the testing devices and associated cable from the list. As an example, the installer may select cable 206 that is coupled between testing devices 280 and 283 (FIG. 2). The control logic 402 uses the control data 405 to determine which connectors and pins are to be used in the test based upon the selection by the installer.

The testing methods are now described for determining if a wire is connected, connected properly, and is operating accordingly.

Figure 8:
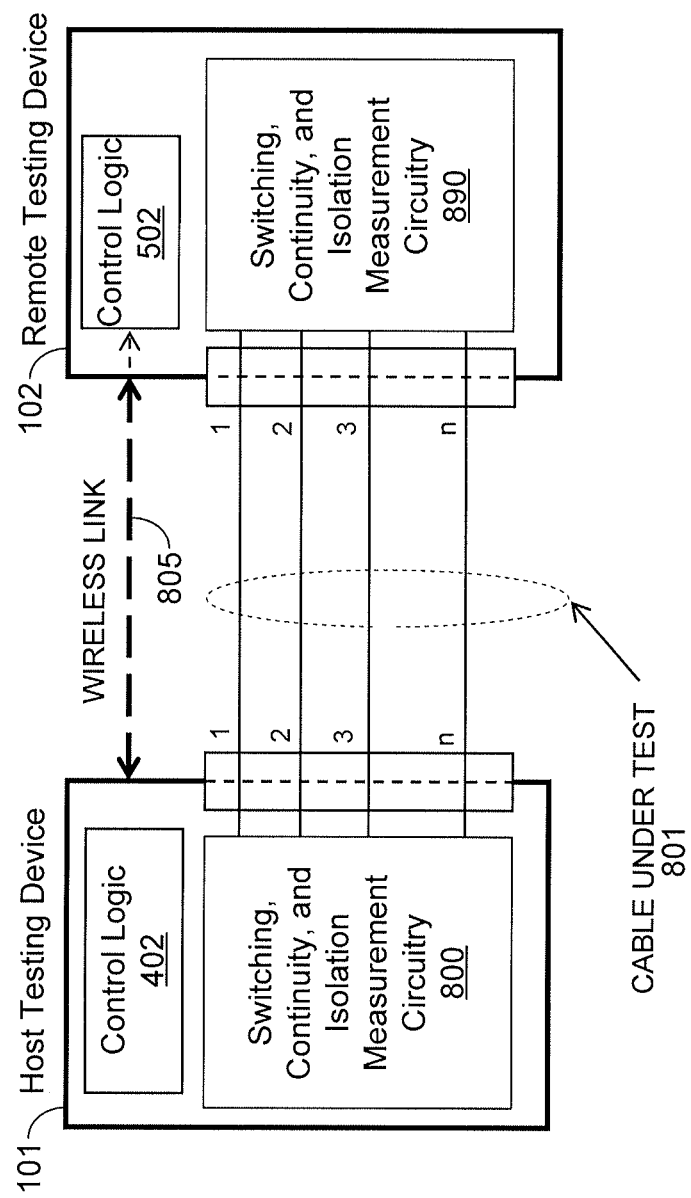
FIG. 8 is a block diagram of a host testing device such as is depicted in FIG. 4.

FIG. 8 is a block diagram depicting an exemplary circuit that may be used to test an electrical component of the system 100 (FIG. 1). FIG. 8 depicts the host testing device 101 and the remote testing device 102. Connected between the Host testing device 101 and remote testing device 102 is a cable-under-test 801 that comprises wires 1 through n.

As will be discussed further herein, in one embodiment, the wires 1 through n may be grouped together according to the pins to which they are connected. Specifically, if a plurality of the wires are coupled to a common pin then the plurality is grouped together. A plurality of wires grouped together based upon a common connection is referred to as a "net."

The host testing device 101 comprises the control logic 402. Further, the host testing device 101 comprises switching, continuity, and isolation measurement circuitry 800, which is described in greater detail hereafter.

The remote testing device 102 comprises the control logic 502. Additionally, remote testing device 102 comprises switching, continuity, and isolation measurement circuitry 890.

A wireless link 805 communicatively couples the host testing device 101 to the remote testing device 102, as is described with reference to FIGS. 4 and 5. Note that during testing, the host testing device 101 transmits test commands to the control logic 502 of the remote testing device 102 via the wireless link 805. In addition, the remote testing device 102 may transmit requested data to the host testing device 101 via the wireless link 805.

Prior to testing, the cable data 405 (FIG. 4) is loaded onto the host testing device 101, as described hereinabove with reference to FIGS. 6 and 7. Note that the cable data 405 reflects the wiring topology that defines which wires are connected to which pins on the connectors of the host testing device 101 and the remote testing device 102.

In the embodiment depicted in FIG. 8, a test program 450-452 (FIG. 4) has been loaded onto the host testing device 101 and selected by an installer. Once selected, the host testing device 101 becomes the controller of any tests that may be performed on the wires 1 through n in the configuration depicted. In this regard, tests on the wires 1 through n will initiate from the host testing device 101, including test commands being sent to the remote testing device 102.

The control logic 402 in conjunction with the control logic 502 tests continuity and isolation resistance for each wire. In one embodiment, the control logic 402 performs such test one wire at a time; however in other embodiments the wires may be tested in parallel, i.e., more than one wire is tested at the same time. During the testing of a particular wire, all other wires within the cable-under-test 801 are connected to ground. In this regard, prior to testing, the control logic 402 transmits a message to the control logic 502 that commands the control logic 502 to connect all wires except for the wire being test to ground. In response, the control logic 502 instructs the circuitry 890 to connect all wires to ground except the wire being tested.

The control logic 402 then instructs the circuitry 800 to perform operations and to take measurements related to the wires 1 through n. Once measurements are taken, the control logic 402 performs calculations that determine whether a particular wire 1 through n is working properly. For example, the control logic 402 may measure a voltage and calculate a resistance. The control logic 402 may compare the resistance calculated to a limit, e.g., the isolation or continuity limit identified in the data 700 (FIG. 7) to determine if the wire is working properly.

As indicated hereinabove, the wires 1 through n may comprise a net. Notably, one of the wires depicted may comprise a plurality of wires that are connected to a common pin. When a net is being tested, as opposed to a single wire, the control logic 402 may transmit a command to the control logic 502 to ground all wires contained within a net. In response, the control logic 502 instructs the circuitry 890 to ground all wires within a net. Note that in one embodiment, the system 100 (FIG. 1) may comprise remote testing devices, e.g., remote testing device 104 (FIG. 1) and remote testing device 105 (FIG. 1) that are coupled via a cable 110 that is not connected to the host testing device 101 (FIG. 1). In such a scenario, the host testing device 101 transmits a command to one of the testing devices, e.g., remotes testing device 105, to connect all wires not be tested to ground. In addition, the host testing device 101 transmits a command to the other remote testing device, e.g., remote testing device 104, to take measurements relating to the wire being tested and transmit the measurements to the host testing device 101. Once the test is completed, the remote testing device 104 transmits measurements taken to the host testing device 101, and the control logic 402 determines whether there is a fault in the cable tested.

Note that while a test is being performed, the host testing device 101 and/or the remote testing device 102 may activate their respective output interfaces 408 and 508 to alert the installer that a test is underway. In this regard, the output interface activated may include a light emitting diode (LED) that blinks a particular color, an LCD that displays text indicating a test is being performed, e.g., "TESTING," or any other type of output interface that could notify the installer that a test is underway.

Figure 9:
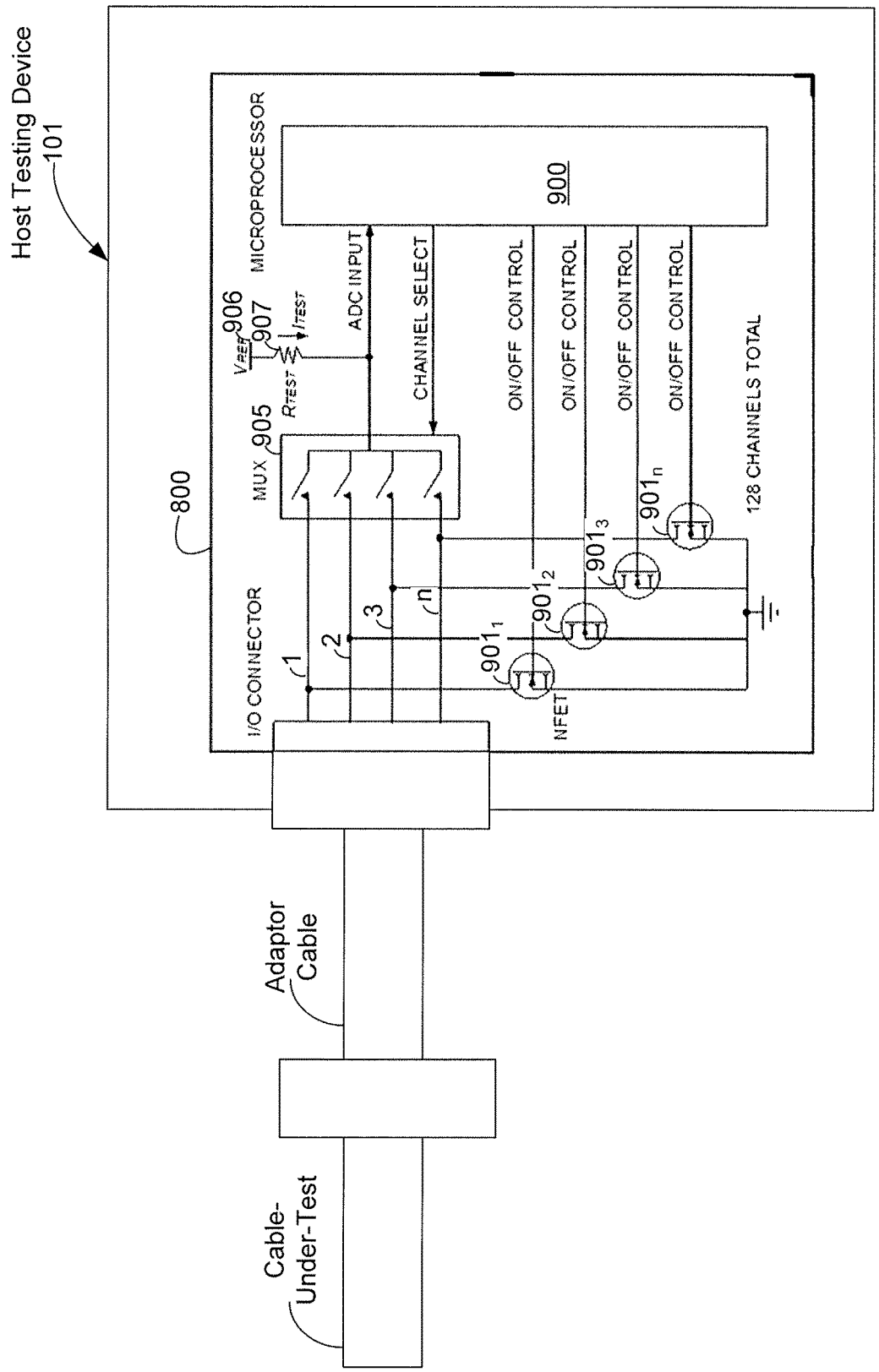
FIG. 9 is a block diagram of exemplary hardware for a host testing device such as is depicted in FIG. 4.

FIG. 9 depicts exemplary circuitry 800 for the host testing device 101 for performing continuity and isolation testing on a cable-under-test. The circuitry 800 comprises a microprocessor 900, a series of multiplexers 905, and a series of transistors $901_1$-$901_n$.

In one embodiment, during operation, the host testing device 101 transmits a wireless signal to the remote testing device 102 (FIG. 8) that comprises data indicative of a command to connect to ground all wires not being tested. During the test, the control logic 402 instructs the microprocessor to perform certain functions. In one embodiment, the microprocessor 900 instructs a multiplexer 905 to select the wire being tested, e.g., one of the wires 1 through n. Note that the control logic 402 (FIG. 8) that is controlling the testing may use the cable data 405 to determine which wires is to be selected. Once selected, i.e., the switch corresponding to the wire being tested is closed, the microprocessor 900 connects the remaining wires to ground via the transistors $901_1$-$901_n$. The microprocessor 900 calculates the resistance (not shown) in the wire being tested via a voltage divider created when the switch is closed with $V_{ref}$ 906, $R_{test}$ 907, and the voltage differential of the wire being tested to ground. The microprocessor 900 then converts the voltage differential of the wire being test to ground to a digital value and calculates the resistance in the wire being tested, which is described further with reference to FIG. 10.

Figure 10:
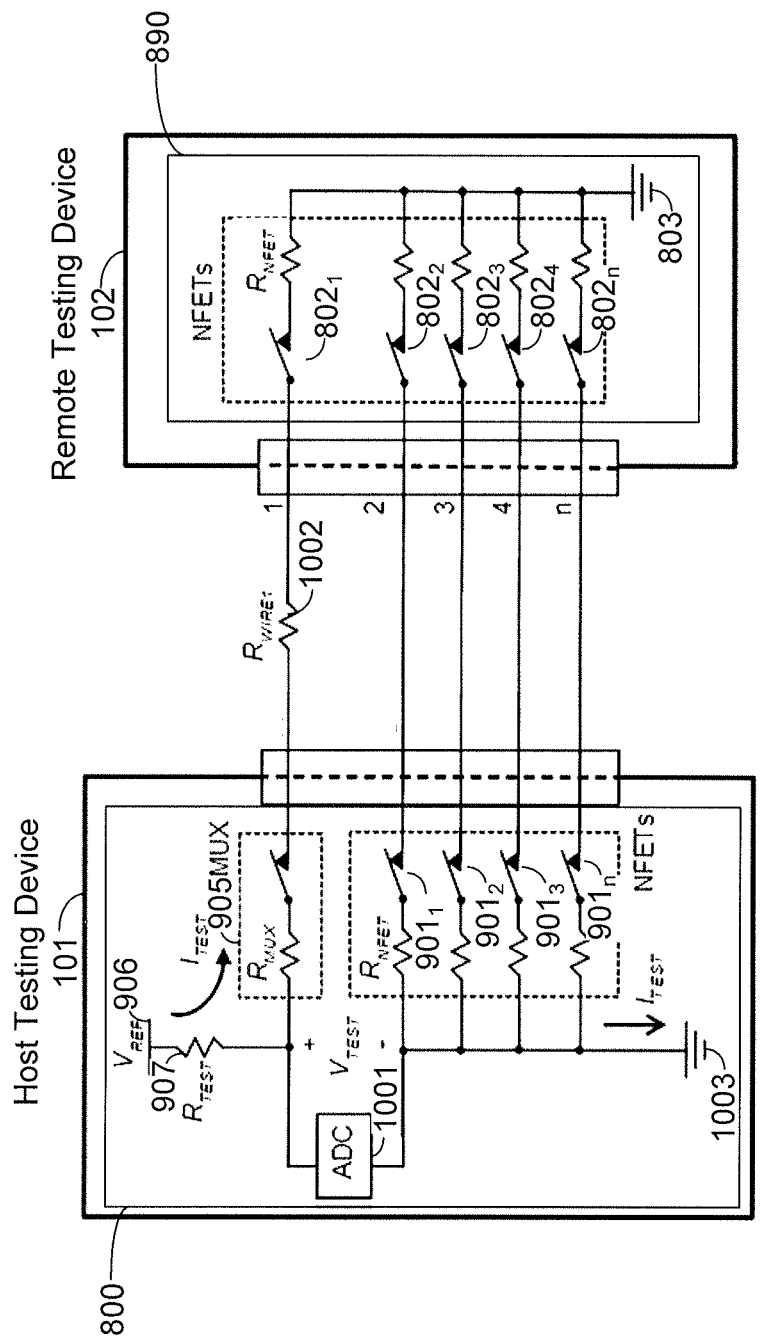
FIG. 10 is a block diagram of exemplary hardware of a host testing device such as is depicted in FIG. 4 and a remote testing device such as is depicted in FIG. 5.

In this regard, FIG. 10 depicts a block diagram of exemplary circuitry 800 and 890 implemented in the host testing device 101 and the remote testing device 102, respectively. Further, with reference to FIG. 10 a continuity test shall be described.

The remote testing device 102 comprises the switches $802_1$-$802_n$ corresponding to the wires 1 through n, which may be implemented with a series of transistors. Further, as described hereinabove with reference to FIG. 9, the host testing device 101 comprises the series of multiplexers 905, the series of transistors $901_1$ through $901_n$ corresponding to the wires 1 through n, and an analog-to-digital converter (ADC) 1001.

During continuity testing, each of the wires 1 through n is tested. In one embodiment, resistance in the wire being tested is calculated and compared with a continuity test limit, which is identified in the cable data 405 (FIG. 4). If the resistance in the wire is greater than the test limit, this indicates a continuity fault, and the test on the wire fails.

In performing the continuity test, the host testing device 101 connects all wires to ground 1003 via the transistors $901_1$ through $901_n$. Further, the host testing device 101 transmits a command to the remote testing device 102 to connect all wires to ground. In response, the remote testing device 102 connects all wires to ground via transistors $802_1$ through $802_n$. The host testing device 101 selects the wire to be tested by selecting and configuring one of the multiplexers 905.

The host testing device 101 then measures the resistance $R_{wire}$ in each of the wires 1 through n. In this regard, the host testing device 101 selects each wire using the series of multiplexers 905, for example first selecting wire 1, by connecting the wire to the reference voltage $V_{ref}$ 906 through resistor $R_{test}$ 907. A current $I_{test}$ then flows from $V_{ref}$ through the wire being tested, e.g., wire 1, and returns through wires 1 through n to ground 1003. The ADC 1001 converts the voltage differential $V_{test}$ between the wire being tested, and ground and the control logic 402 (FIG. 4) calculates $R_{wire}$ via the following formula:

$$R_{wire}=V_{ref}(R_{test}/(V_{ref}-V_{test}))-(R_{test}+R_{max}+R_{nfet})$$

The control logic 402 compares the calculated Rwire with the test limit for the continuity test, e.g., 1 Ohm. If it $R_{wire}$ is greater than the test limit, the wire has a continuity fault. The installer is then alerted of the fault via the output interface 408 of the failure on the particular wire tested.

Note that each of the wires 1 through n are tested for continuity. In this regard, the method described above is performed for each of the wires 1 through n, and a result of the test is displayed to the installer via the output interface 408 (FIG. 4), and data indicative of the result is stored as test data 404 (FIG. 4).

Figure 11:
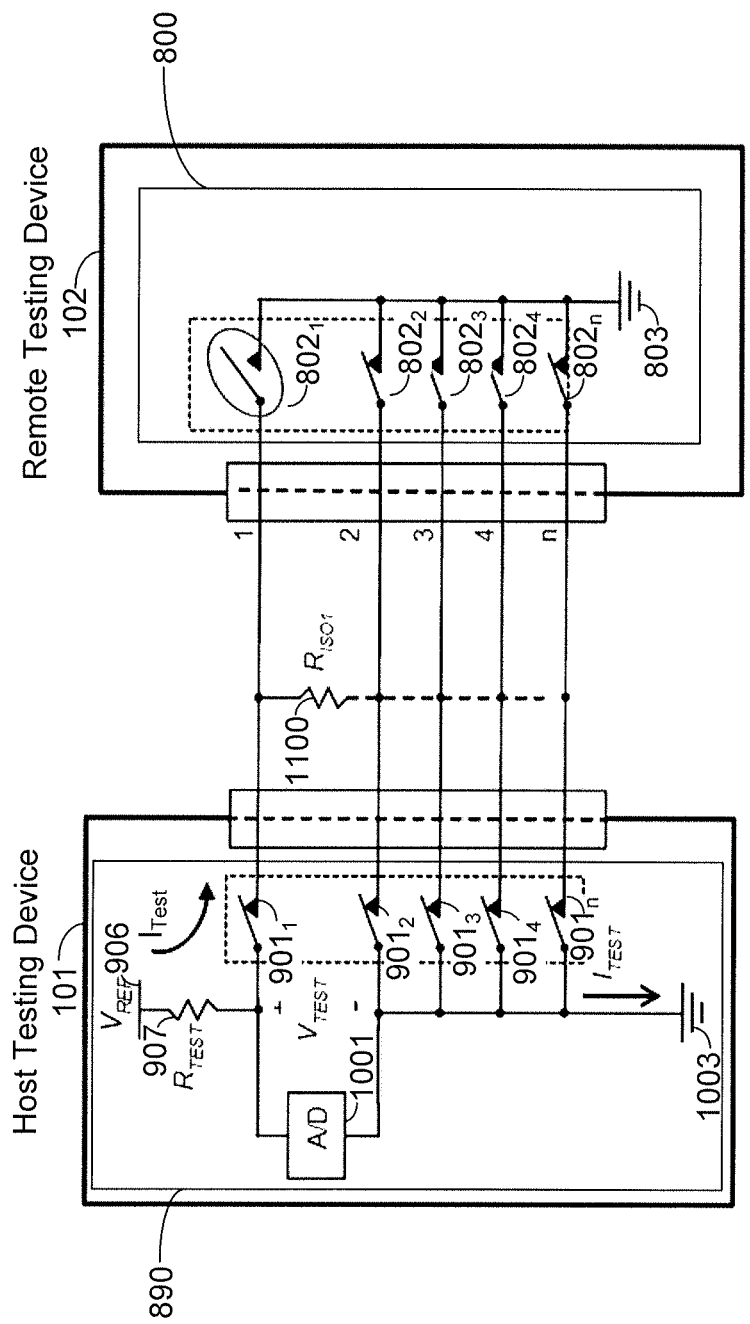
FIG. 11 is a block diagram of the exemplary hardware depicted in FIG. 10 further showing an iteration of a test performed with an open switch.

FIG. 11 depicts a block diagram of hardware implemented in the host testing device 101 and the remote testing device 102. Further, with reference to FIG. 11 an isolation resistance test shall be described.

During isolation testing, each of the wires 1 through n is tested. In one embodiment, resistance between the wire being tested and the remaining wires is compared with an isolation test limit. If the resistance is less than isolation the test limit, this indicates an isolation fault, and the test on the wire fails.

In performing the isolation test, the host testing device 101 connects all wires to ground 1003 via the transistors 901$_1$ through 901$_n$. Further, the host testing device 101 transmits a command to the remote testing device 102 to disconnect the wire to be tested. Thus, as an example in FIG. 11, the switch 802$_1$ is opened in response to the command from the host testing device 101. Notably, each of the wires 1 through n is tested consecutively for isolation resistance.

The host testing device 101 then measures the resistance $R_{ISO1}$ in each of the wires 1 through n. In this regard, the host testing device 101 selects each wire using the series of multiplexers 905, for example first selecting wire 1, by connecting the wire to the reference voltage $V_{ref}$ 906 through resistor $R_{test}$ 907. The ADC 1001 converts the voltage differential $V_{test}$ between the wire being tested and ground, and the control logic 402 (FIG. 4) calculates $R_{ISO1}$ via the following formula:

$$R_{ISO1}=(V_{test}*R_{test})/(V_{ref}-V_{test})$$

The control logic 402 compares the calculated $R_{ISO1}$ with the test limit for the isolation test, e.g., 100 kΩ. If it $R_{ISO1}$ is less than the test limit, the wire has an isolation fault. The installer is then alerted of the fault via the output interface 408 of the failure on the particular wire tested.

Note that each of the wires 1 through n are tested for isolation. In this regard, the method described above is performed for each of the wires 1 through n, and a result of the test is displayed to the installer via the output interface 408 (FIG. 4), and data indicative of the result is stored as test data 404 (FIG. 4).

Figure 12:
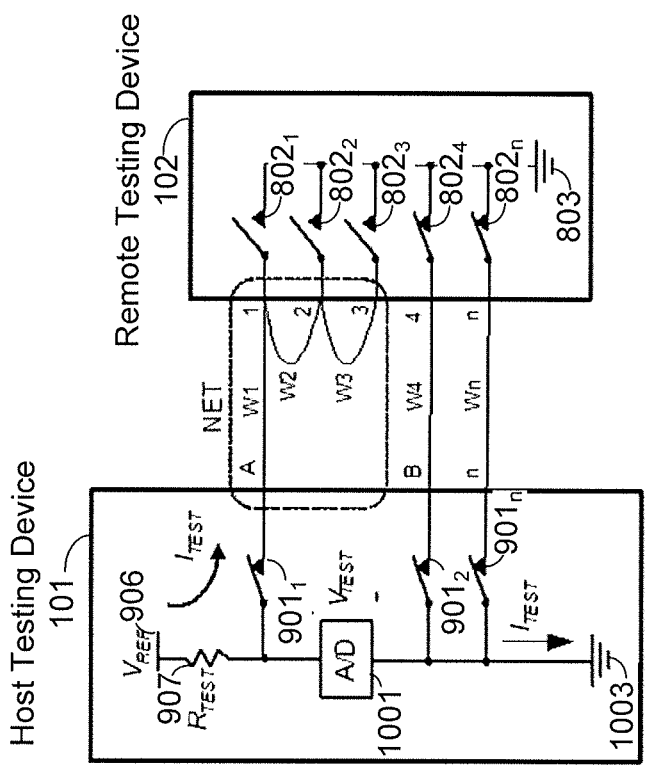
FIG. 12 is a block diagram of the exemplary hardware depicted in FIG. 10 further showing another iteration of a test performed.

FIG. 12 depicts a test schematic for use in the architecture and functionality of the system 100 (FIG. 1). In this regard, FIG. 12 is similar to FIG. 10 regarding components used on the host testing device 101 and the remote testing device 102.

Notably, FIG. 12 further depicts a plurality of wires labeled "W1" through "Wn." Where there is a plurality of wires, e.g., W1 through W3 that are connected together, this is referred to as a "net." In this regard, the wires W1 through W3 share a common connection.

Note that the testing described herein does not require the use of additional ground cables. Instead, the cable data 405 defines wires that are used as a ground path return during test signal measurement. Further, the cable data 405 comprises data that allows for calculating resistances of wires used as ground return wires for test measurements.

Note that in FIGS. 8-12 an embodiment of the system is shown using both a host testing device and a remote testing device. However, as indicated hereinabove with reference to FIG. 3, a testing device in accordance with an embodiment of the present disclosure may operate as a sole testing device, i.e., in the example in FIG. 3 a single testing device 301 (FIG. 3) is used to test the cable 306 (FIG. 3). In an embodiment wherein a single testing device is used, the testing device comprises the circuitry 800 and 890, and the control logic of the testing device governs the execution of a test program using the cable data 405 (FIG. 4) of data, e.g., data 600 (FIG. 6) for a single tester.

Figure 13A:
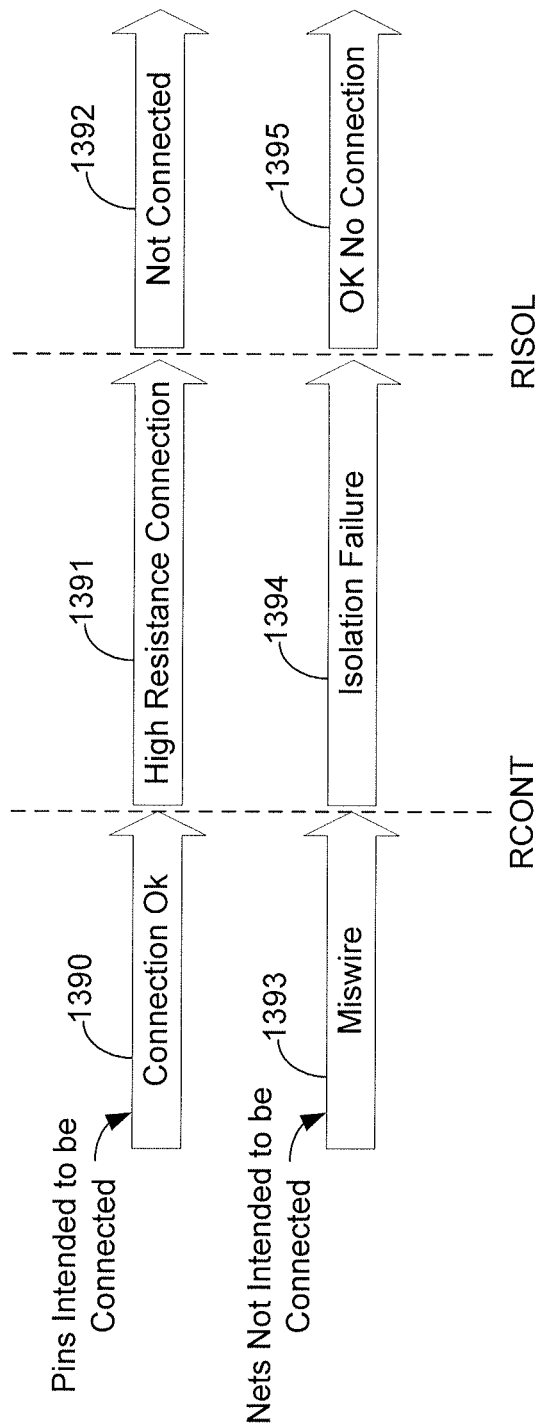
FIG. 13A is a flowchart depicting exemplary architecture and functionality of the host testing device such as is depicted in FIG. 4.

FIG. 13A provides an exemplary fault algorithm describing the faults as used in testing of the cables-under-test. FIG. 13A depicts an explanatory fault flow wherein pins are intended to be connected and an explanatory fault flow wherein nets are not intended to be connected. Both of which are tested as described hereinafter with reference to FIG. 13B.

For purposes of the description the term "Net" means a group of pins that are connected together and are always at the same voltage. "LT" means less than and "GT" means greater than. Further, RMEAS means calculated resistance using $V_{ref}$, $R_{test}$, and $V_{test}$, as described hereinabove. "RCONT" means the continuity threshold test resistance (test limit), and RISOL means the isolation threshold test resistance (test limit).

In regards to pins intended to be connected, if the measured resistance in a wire is less than RCONT then the connection is operating properly, as indicated by arrow 1390. However, if the resistance is greater than RCONT and less than RISOL, this indicates a high resistance connection, as indicated by arrow 1391, which indicates a fault. Further, if the resistance measured is greater than RISOL, this indicates that the pin is not connected, as indicated by reference arrow 1392, which indicates a fault.

In regards to nets not intended to be connected, if the measured resistance in a wire is less than RCONT this indicates a miswire, as indicated by arrow 1394. Further, if the resistance is greater than RCONT and less than RISOL, this indicates an isolation failure, as indicated by arrow 1395, which indicates a fault. However, if the resistance measured is greater than RISOL, this indicates that the pins are operating properly.

Each of the faults described above are now defined. In this regard, a "miswire" fault, as shown in arrow 1393 is when a pin is connected to another net with resistance less than RCONT. The Value of RCONT used for this particular test is the largest value specified for the wirelist, e.g., RCONT shown in the data 600 (FIG. 6) or 700 (FIG. 7).

An "isolation fault" is shown with reference to arrow 1394. An isolation fault is when a net is connected to another net with greater than the RCONT and less than RISOL.

A "not connected fault" is shown with reference to arrow 1392. A not connected fault means the resistance between two pins intended to be connected is greater than RISOL.

A "high resistance connection fault" is indicated by arrow 1391. A high resistance connection fault is when the resistance between two pins intended to be connected is greater than RCONT and less than RISOL.

Figure 13B:
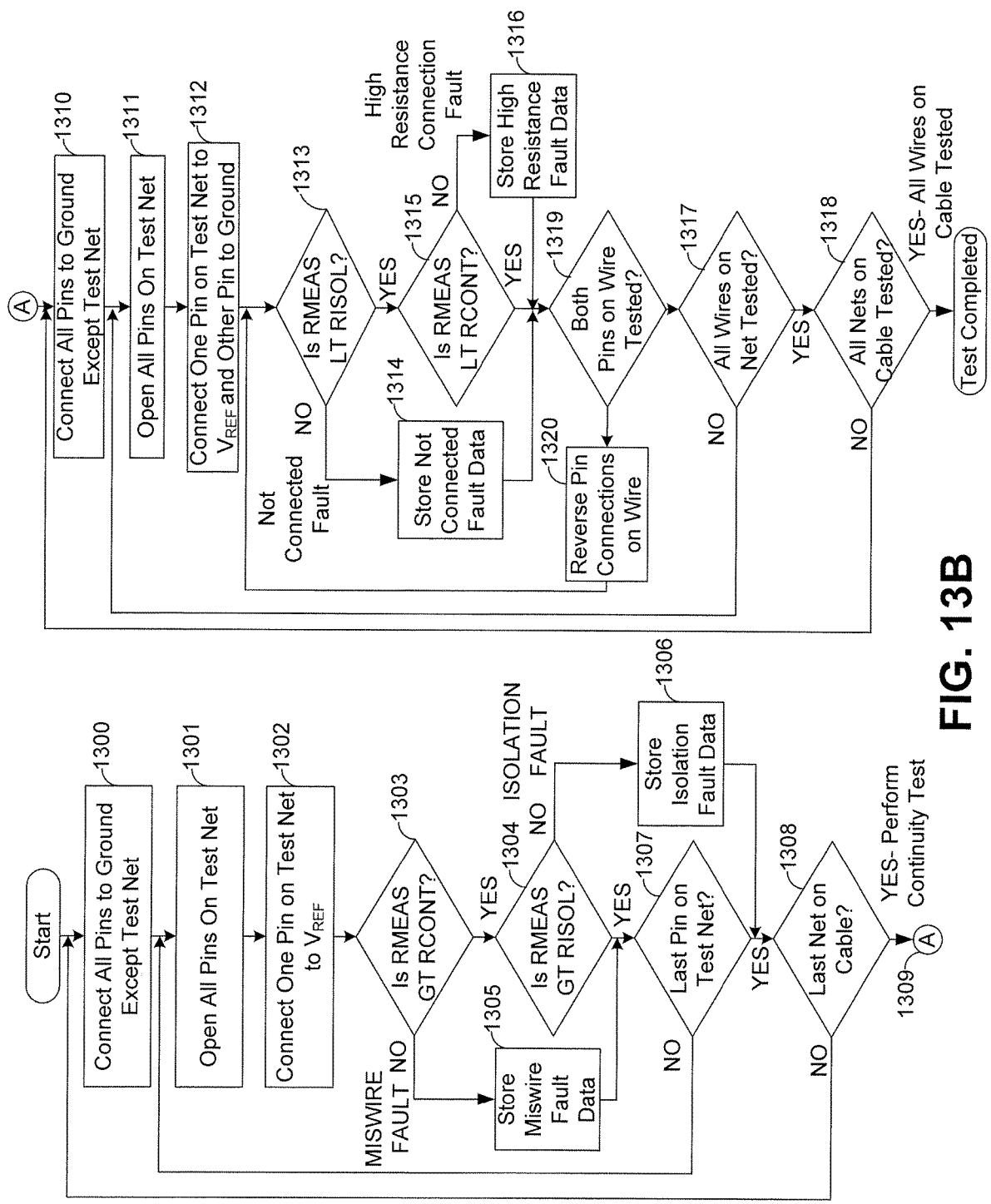
FIG. 13B is a diagram describing faults that may occur when a cable is tested via the host testing device such as is depicted in FIG. 4.

FIG. 13B depicts exemplary architecture and functionality of an exemplary testing of wires in accordance with an embodiment of the present disclosure. The following flowchart describes tests performed at the direction of host control logic 402 (FIG. 4) and/or remote control logic 502 (FIG. 5) based upon a test program selected by an operator of the host testing device 101 (FIG. 4).

At step 1300, all pins are connected to ground on the host testing device 101 and the remote testing device 102 (FIG.

12) except those pins on the test net, i.e., the wires being tested. In this regard, the host control logic 402 transmits data indicative of grounding all wires except the wire being tested to the remote control logic 502. In response, the remote control logic 502 signals the circuitry to ground all wires except the wire being tested. In addition, the host control logic 402 signals the circuitry 800 resident on the host testing device 101 to ground all wires except the wire under test. As described hereinabove, the host control logic 402 uses the cable data 405 that comprises wiring topology to identify test nets and identify pins for grounding.

Further, in step 1301, all pins corresponding to wires being tested on one net are open, e.g., switches $802_1$, $802_2$, and $803_3$ are open in FIG. 12. Note that the host control logic 402 transmits a command and/or instruction to the remote control logic 502 to open all switches corresponding to the net being tested. The control logic 502 uses the cable data 405 (FIG. 4) to determine what pins, and hence what switches, are to be actuated to effectuate this step.

In step 1302, one pin, W1 (FIG. 12) on the test net, i.e., W1, W2, and W3, is connected to $V_{ref}$ 906 (FIG. 12). In performance of this step, the host control logic 402 directs the circuitry 800 to connect the pin to the reference voltage. The host control logic 402 uses the cable data 405 to determine which pin, and hence which wire, is to be connected to the reference voltage.

In step 1303, the host control logic 402 calculates a resistance and compares the calculated resistance of the wire being tested to RCONT. If the calculated resistance (RMEAS) is not greater than the continuity resistance test limit (RCONT), then the control logic 402 (FIG. 4) stores data indicative of a miswire fault in step 1305 in the test data 404 (FIG. 4). Note that a "miswire" means that one pin on the test net is connected to another net with resistance less than the continuity resistance test limit, as is described with reference to FIG. 13B. Further note that the value of RCONT used for this test is the largest value specified for the wirelist indicated by the installer via the input interface 407 (FIG. 4), the excel spreadsheet uploaded to the host testing device 101, or a tester global value.

If the calculated resistance is greater than the continuity resistance test limit, the host control logic 402 compares the measured resistance to the isolation resistance test limit (RISOL) in step 1304. If the calculated resistance is not greater than the isolation resistance test limit in step 1304, the control logic 402 stores data indicative of an isolation fault in the test data 404. Note that an isolation fault means that the net is connected to another net or group of nets with greater than the continuity resistance test limit and less than the isolation resistance test limit, as described with reference to FIG. 13A.

If the calculated resistance is greater than the isolation resistance test limit in step 1304, then the host control logic 402 tests the next pin in the test net as indicated in step 1307. In this regard, the test begins again at step 1301. If all the pins in the test net have been tested, the host control logic 402 tests the next test net on the cable-under-test in step 1308. In this regard, the test begins again at step 1300.

If all the test nets in the cable-under-test have been tested, the continuity test is performed. In this regard, at step 1310 all pins are connected to ground except the test net pins. In step 1311, all pins on the test net are opened.

In step 1312, one pin on the wire being tested is connected to $V_{ref}$ 906, and the other pin is connected to ground. If the calculated resistance is not less than the isolation resistance test limit in step 1313, the control logic 402 stores data indicative of a "not connected fault," which means that the resistance between two pins intended to be connected is greater than the isolation resistance test limit.

If the calculated resistance is less than the isolation resistance test limit in step 1313, the calculated resistance is tested versus the continuity resistance test limit in step 1315. If the calculated resistance is not less than the continuity resistance test limit in step 1315, the control logic 402 stores data indicative of a "high resistance connection fault," which means that the resistance between two pins intended to be connected is greater than the continuity resistance test limit and less than the isolation resistance test limit.

If the calculated resistance is not less than the isolation resistance test limit in step 1313, the control logic 402 stores data indicative of a not connected fault in step 1314, which means that the resistance between the two pins intended to be connected is not less than isolation resistance test limit.

If the measured resistance is less than the continuity resistance test limit in step 1315, the control logic 402 determines if both pins on a wire have been tested, as indicated in step 1319. If not, the control logic 402 reverses the pin connections of wires, as indicated in step 1320, and tests the other pin connection by starting the flow again at step 1313.

If both pins have been tested in step 1319, the control logic determines if all wires in a net have been tested in step 1317. If no, the control logic 402 returns back to 1311 to test the additional wires. If yes, the control logic 402 determines if all nets have been tested. If no, the control logic 402 returns to step 1310 to test the remaining nets. If yes, the test is completed. All wires of all nets have been tested.

Figure 14:
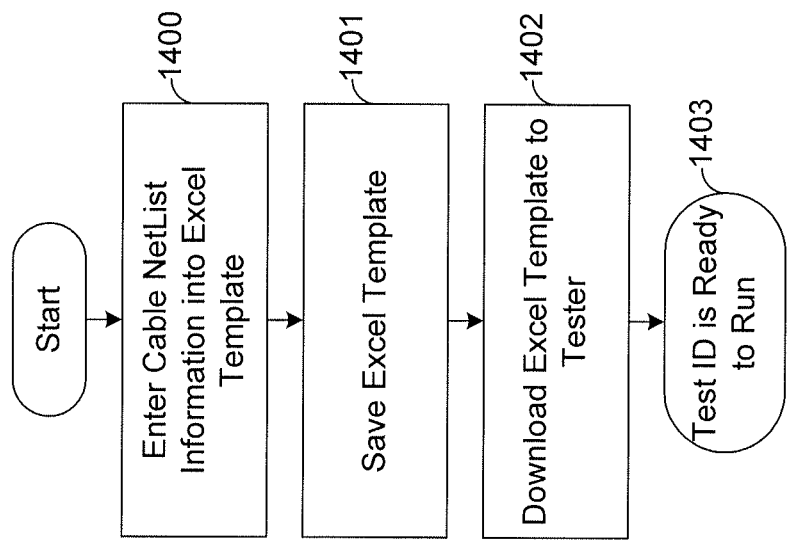
FIG. 14 is a flowchart depicting an exemplary method for downloading a test program to the host testing device of FIG. 4.

FIG. 14 is a flowchart of an exemplary download of cable data 405 (FIG. 4) of the system 100 (FIG. 1). In this regard, in step 1400 an installer (or other use of the computer 121 (FIG. 1)) generates a cable net list (cable data 405), for example in a spreadsheet as is shown in FIGS. 6 and 7. In step 1401, the installer saves the cable data 405 locally on the computer 121 (FIG. 1).

Via a link, e.g., a universal serial bus, a Bluetooth transceiver, an Ethernet connection, or the like, the installer downloads the cable data 405 to the host testing device 101 (FIG. 1), as indicated in step 1402. Once the cable data 405 is downloaded to the host testing device 101, the test is ready for execution, as indicated in step 1403.

Figures 15A, 15B, 15C:
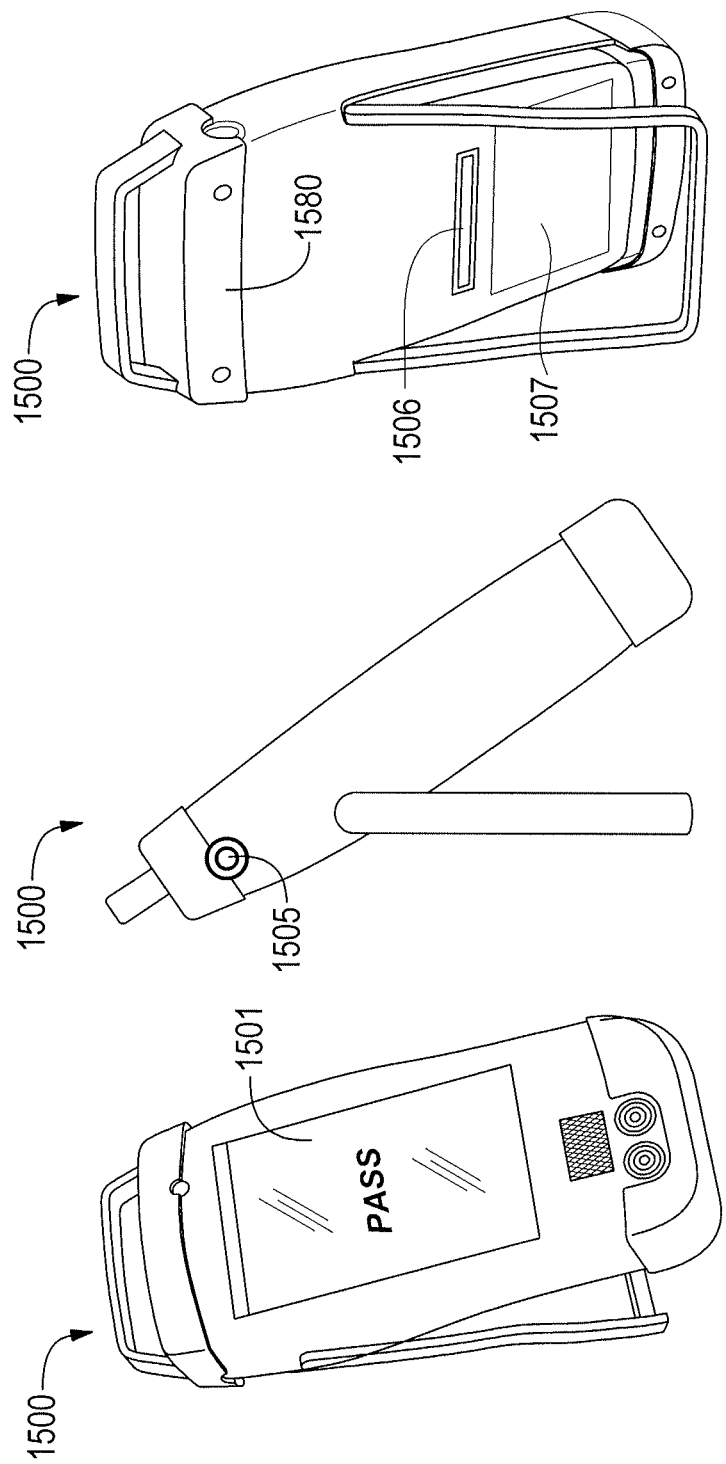
FIG. 15A is a front perspective view of a testing device of FIG. 4.
FIG. 15B is a side view of the testing device of FIG. 15A.
FIG. 15C is a back perspective view of the testing device of FIG. 15A.

FIG. 15A depicts a front view of an exemplary testing device 1500 that may be used as the host testing device 101 (FIG. 1) or remote testing devices 102-106 (FIG. 1). The testing device 1500 comprises a touchscreen 1501 to be used as the output interface 408 (FIG. 4) and input interface 407 (FIG. 4). Note that attached hereto is Appendix A that describes various displays depicting input/output via the touchscreen 1501.

Additionally, the device 1500 comprises wireless sensor interfaces 1501. The wireless sensor interfaces 1501 may be used to communicate with custom or third-party wireless sensors. In addition, the wireless sensor interfaces 1501 allow the device 1500 to manage multiple wireless sensors.

In one embodiment, the device 1500 comprises ports 1503 such that the device 1500 can measure voltage, current, capacitance, and resistance. With a smart adapter having a plurality of spring contacts, the device 1500 may use the ports 1503 to set-up, test, and view multiple inputs simultaneously. The ports 1503 further allow the device 1500 to initiate and view output of remote multimeters. Note that the term "smart adapter" is a collection of electronics, for example on a printed circuit board, that are configured for performing a particular function. In regards to the present disclosure, the smart adapter may, for example, be configured to performing radio-frequency testing.

FIG. 15B is a side view of the device 1500 showing a Bayonet Neill-Concelman (BNC) connector 1505. Such device 1505 may be configured to initiate time-domain reflectometry (TDR) functionality to detect distance to an open circuit or distance to short circuit. In addition, the connector 1505 may be used to verify the length of cable. Thus, the BNC connector 1505, combined with the testing features described hereinabove, may be used to determine an exact fault in a cable-under-test.

In one embodiment, the control logic, e.g., host control logic 402 (FIG. 4), is configured for receiving data indicative of a map of the system being tested. The map data may be a computer-aided drawing of the system. As noted, the TDR may determine the distance to an open or short circuit. In such an embodiment, the control logic searches the map data to determine where in the map data the open circuit or short circuit is located based upon the distance data measured by the TDR. The control logic then displays to an operator the map showing the location on the map of the open or short circuit.

FIG. 15C depicts a back view of the device 1500. Notably, the device 1500 comprises a connector 1506 for connecting the device 1500 to an adapter cable as described hereinabove. Further as described, the device 1500 comprises a module 1507 that may be field interchangeable, i.e., interchangeable in the field, so that the device 1500 may connect to a 128-pin connector with one type of module or connect to a plurality of spring contacts with another type of module. Thus, the adapter module 1507 generally provides the hardware for connecting the device 1500 to a cable-under-test, whether a 128-pin connector or a plurality of spring contacts.

Note that the adapter module 1507 may be other types of modules in other embodiments. For example, the adapter module 1507 may contain electronic circuitry (not shown) that comprise hardware for electronic signal stimulus, measurement capabilities, or direct current to optical frequency translation. Adapter operation may be controlled via the touchscreen 1501. Further, software for controlling one or more types of adapter modules may be stored in memory 401 (FIG. 4). Some adapters may contain user-configurable features, such as electronic circuits, indicators, computer processors, data bus, and memory.

Additionally, while not specifically shown in FIG. 15B, the housing of the device 1500 may further comprise a flashlight. The flashlight would be powered by the internal battery or other power source. Further, it may be located, for example, at location 1580 on the housing of the device 1500.

FIG. 16 depicts a system 1600 in accordance with an embodiment of the present disclosure. The system 1600 comprises a plurality of testing devices 1603-1607 such as have been described hereinabove. As is described hereinabove, the testing devices 1603-1607 may be used to test system components on a vehicle, including, but not limited to cables and other electronic components.

In this regard, the devices 1603-1607 may be used to measure and calculate test results, which are stored resident on the devices 1603-1607 as test data 404 (FIG. 4) in memory 401 (FIG. 4). In such embodiment, each of the devices 1603-1607 comprises a wireless transceiver 409 (FIG. 4) for connecting to a computer, a computer network, or the Internet 1601 via a communication device 1608. As an example, the communication device 1608 may be a router. Note that the wireless transceiver is to be broadly construed to cover any type of software or hardware that connects the devices 1603-1607 to a network for transmitting and receiving data from a central server and/or the Internet. As an example, the transceiver 409 may communicatively couple the testing devices 1603-1607 to a cellular and/or data network.

The system 1600 further comprises a computer network, internet or cloud servers 1602. The computer network, internet or cloud servers 1602 is any type of computing device known in the art or future-developed. The computing device 160 communicates with the devices 1603-1607 over the Internet 1601. In this regard, the devices 1603-1607 may transmit data indicative of test data 404 to the computer network, internet or cloud servers 1602.

The computing device 1602 may store the test data 404 received from the devices 1603-1607. The computer network, internet or cloud servers 1602 may be configured to display the data 404 to a user for analysis or generate reports based on the test data 404.

Additionally, the computing device 1602 may transfer data to the devices 1603-1607. In this regard, the computer network, internet or cloud servers 1602 may transfer data indicative of a test routine to be executed, upgrades, technical information, or other programs, which is described further with reference to FIGS. 17, 18 and 19. In addition, control logic 402, control logic 502, configuration data 403, test data 404, and cable data 405 may also be transferred to the devices 1603-1607. Such data may be viewed on the devices 1603-1607.

Figure 17:
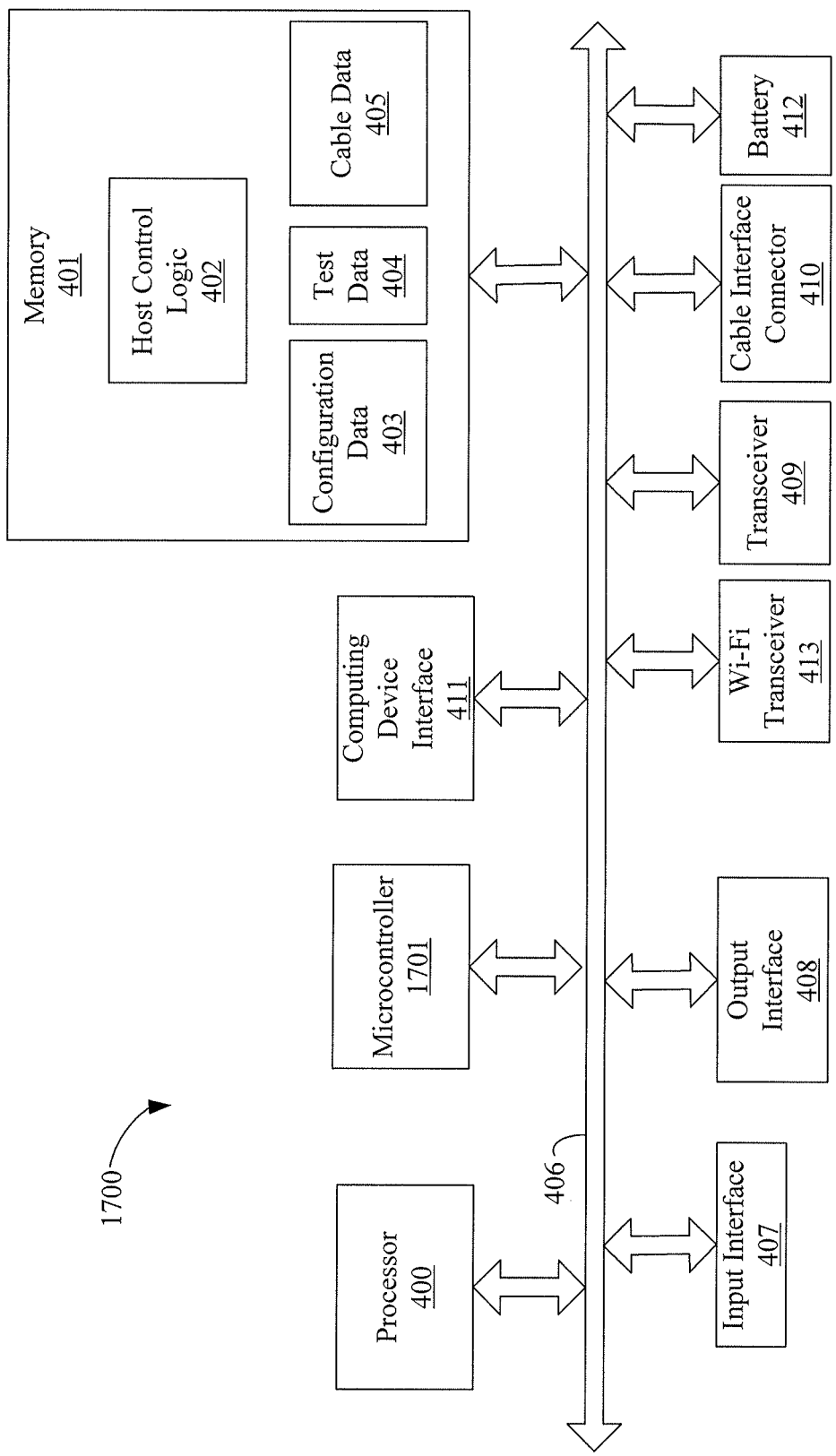
FIG. 17 is a block diagram of an exemplary host testing device in accordance with an embodiment of the present disclosure.

FIG. 17 depicts another embodiment of an exemplary testing device 1700 that may be used as either a host testing device or a remote testing device (such as described with reference to FIGS. 1-16). FIG. 17 is substantially similar to both FIGS. 4 and 5. The testing device 1700 shall be described herein as being a host testing device, similar to the one depicted in FIG. 4; however the functionality described herein may also be applied to a remote testing device as described in FIG. 5.

The notable difference between the testing device 1700 and the testing devices of FIGS. 4 and 5 is that the testing device 1700 comprises a microcontroller 1701. In one embodiment, the microcontroller 1701 is a printed circuit board (not shown) that is inserted in the testing device 1700. For clarity, reference numerals for components common to the testing device 1700 and the testing devices of FIGS. 4 and 5 are used in the following description.

The testing device 1700, similar to the testing devices depicted in FIGS. 4 and 5, comprises the processor 400 and memory 401. In addition, the testing device 1700 comprises the input interface 407, and the output interface 408 (e.g., an LCD display device), which behave as described with reference to FIG. 5. Further, the testing device 1700 comprises the cable interface connector 410 and the battery 412.

The processor 400 communicates with the components, including the memory 401, the computing device interface 411, the input interface 407, the output interface 408, and the cable interface connector 401, over the bus 406. During operation, the testing device 1700 may be coupled to a cable-under-test 107-112 (FIG. 1), as described hereinabove. The host control logic 402 controls communication with multiple remote testing devices 102-106 (FIG. 1) in running various tests, described hereinabove, to ensure the integrity of each of the cables 107-112. In this respect, the testing device 1700 operates as described with reference to the host testing device 101 (FIG. 1) and the remote testing devices 102-106.

Note that different than the remote testing devices and host testing devices described hereinabove with reference to FIGS. 4 and 5, the exemplary testing device 1700 comprises the microcontroller 1701, as indicated hereinabove. The microcontroller 1701 provides additional functionality not described hereinabove with reference to the embodiments of testing devices described with reference to FIGS. 4 and 5. Such additional functionality is described hereinafter with reference to FIGS. 18 and 19.

Figure 18:
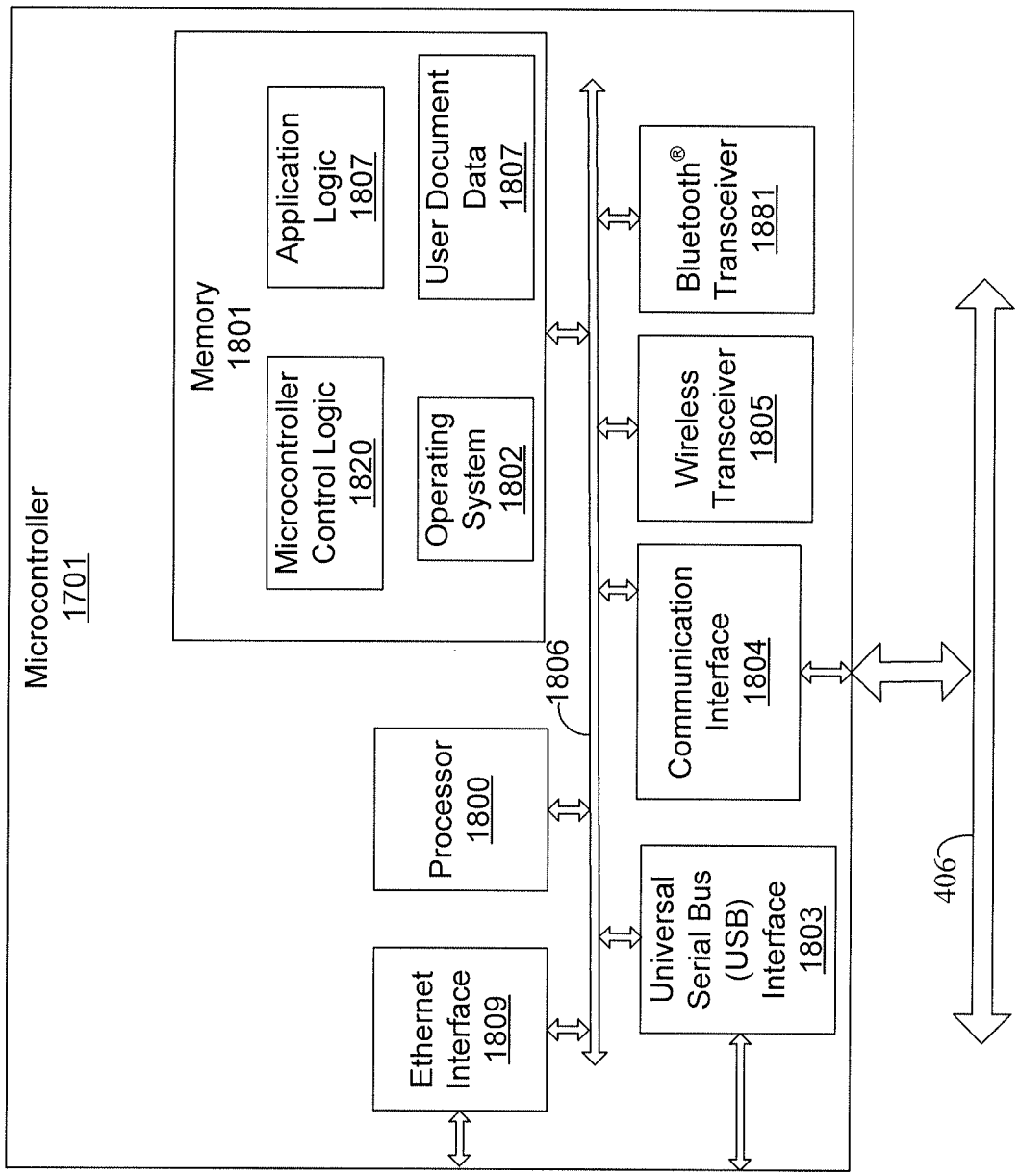
FIG. 18 is a block diagram of an exemplary microcontroller such as is depicted in FIG. 17.

FIG. 18 is a block diagram of an exemplary microcontroller 1701. Note that the host testing devices and remote testing devices described hereinabove with reference to FIGS. 4 and 5 do not utilize a microcontroller 1701.

The microcontroller 1701 comprises at least a processor 1800, memory 1801, and a communication interface 1804. In one embodiment, the microcontroller 1701 is a TX53 printed circuit board (PCB) card, and the processor 1800 is Freescale i.MX535. However, other types of PCBs and other types of processors are possible in other embodiments.

The exemplary memory 1801 may be random access memory (RAM) and/or read only memory (ROM). Note that other types of memory may be used in other embodiments of the exemplary memory 1801.

In the embodiment depicted in FIG. 18, memory 1801 comprises operating system logic 1802. In one embodiment, the operating system logic 1802 is a LINUX operating system. However, other types of operating systems may be used in other embodiments. For example, the operating system logic 1802 may be Android®, Windows®, or any other type of operating system known in the art or future-developed.

In addition, memory 1701 comprises user document data 1807. The user document data 1807 may include, but is not limited to, data indicative of schematics, wiring diagrams, system operating manuals, system troubleshooting procedures, test procedures, and/or repair procedures. As will be described further, the user document data 1807 is any type of data that assists the user of the testing device 1700 (FIG. 17) in the testing and diagnostics of a vehicle, e.g., the CH47 depicted in FIG. 1. In one embodiment, the user document data 1807 may also comprise video data.

The memory 1801 may further comprise application logic 1807. In one embodiment, the application logic 1807 may be Adobe® logic, In this example, the Adobe logic 1807 may display user document data 1807 that is in an Adobe format to the output interface 408 (FIG. 17). The application logic 1807 may be other types of logic, including logic for displaying video to the output interface 408. In this regard, types of video formats include, but are not limited to, AVI, MP3 and 4 and Flash. As additional examples, the application logic may be Microsoft Word®, Mentor®, National Instruments®, Keysight®, and the like.

The communication interface 1804 is any type of interface that enables the processor 1700 to communicate with the testing device's bus 406, also shown in FIG. 17. In this regard, data is transmitted by the processor 1800 through the communication interface 1804 to the processor 400 (FIG. 17). Additionally, the processor 1800 may transmit user document data 1807 to the output interface 408 (FIG. 17) via the communication interface 1804. Further, the processor 1700 may receive particular data from the input interface 407 (FIG. 17) to be stored as user document data 1807.

In the embodiment depicted in FIG. 18, the microcontroller 1701 further comprises a universal serial bus (USB) interface 1803 and a wireless transceiver 1805. Both the USB interface 1803 and the wireless transceiver 1805 may be used to receive data indicative of user document data 1807.

In the embodiment shown, the processor 1800 may access any of the peripherals shown in the testing device 1700. As mere examples, the processor 1800 may access the input interface 407, the output interface 408 (which includes a liquid crystal display (LCD) device and/or audio output), the transceivers 413 and 409, the cable interface connector 410 or the memory 401.

During operation of the testing device 1700, the host control logic 402 (FIG. 17) (or the remote control logic 502 if the device is a remote testing device as shown in FIG. 5), may transfer control of the testing device 1700 from the processor 400 (FIG. 17) to the processor 1800.

Thus, the user may access any user document data 1807 stored in memory 1701 of the microcontroller 1701. As an example, the user may be testing the wiring of the CH47 shown in FIG. 1. The user document data 1807 may include a wiring diagram of the CH47. Thus, the user, in testing the cables of the CH47, may view the wiring diagrams or schematics stored in the user document data 1807. Note that the diagrams will allow pinch-zoom and scroll using a touchscreen input interface 407 (FIG. 17).

The inclusion of the microcontroller 1701 into the testing device 1700 and the capability to transfer control from the processor 400 (FIG. 17) to the processor 1800 provides additional functionality to a user of the testing device 1700.

In one embodiment, a developer of software for the testing device 1700 may access the microcontroller 1701, for example through the USB interface 1803 or the wireless transceiver 1805. In this regard, the developer may couple electronically a monitor (not shown), a keyboard (not shown), and/or a mouse (not shown) (collectively referred to as "development hardware) via the USB interface 1803. Note that various interfaces may be used to interface a development environment with the microcontroller 1701. In this regard, a universal asynchronous receiver/transmitter (UART), a serial peripheral interface (SPI) or SPI bus, or an inter-integrated circuit (I2C) may be employed in the microcontroller 1701 to provide a communication link to the microcontroller 1701 by the development hardware. Note that these are exemplary hardware/software configurations that enable developer hardware to interface with the microcontroller 1701. Other types of configurations may be employed in other embodiments.

Further, the USB interface 1803 may be used to transfer data files (e.g., user document data 1807) or other control logic to the microcontroller 1701. The USB interface 1803 may further be used to interface the microcontroller 1701 to a network (not shown) so that a user may access the memory 1801 for downloading user document data 1807 or logic to the microcontroller 1701.

The wireless transceiver 1805 may also be used to receive user document data 1807 or other types of control logic (not shown). The wireless transceiver 1805 may further be used to interface the microcontroller 1701 to a network (not shown) so that a user may access the memory 1801 for downloading user document data 1807 or logic to the microcontroller 1701. Additionally, the wireless transceiver 1805 may connect with other computer networks (not shown) or the Internet 1601 (FIG. 16).

Note that the memory 1801 may comprise mass storage functionality. In this regard, the memory may contain large sectors of data, files, and/or logic for providing user of the testing device 1700 data or controlling the operation of the microcontroller 1701.

Further, the microcontroller 1701 may be equipped with an Ethernet interface 1809. The Ethernet interface 1809 may be used to transfer data, files, and/or control logic to the microcontroller 1701. Further, the Ethernet interface 1809 may be used to interface the microcontroller 1701 with a network.

The microcontroller 1701 further comprises a Bluetooth® transceiver 881. The Bluetooth® transceiver 881 enables the microcontroller 1701 to communicate short-range with cellular phones, computers, or other electronic devices.

In one embodiment, the microcontroller 1701 may be electrically coupled to a printer. In this regard, a printer may interface microcontroller 1701 through the USB 1803, the Ethernet interface 1809, or the wireless transceiver 1805.

Figure 19:
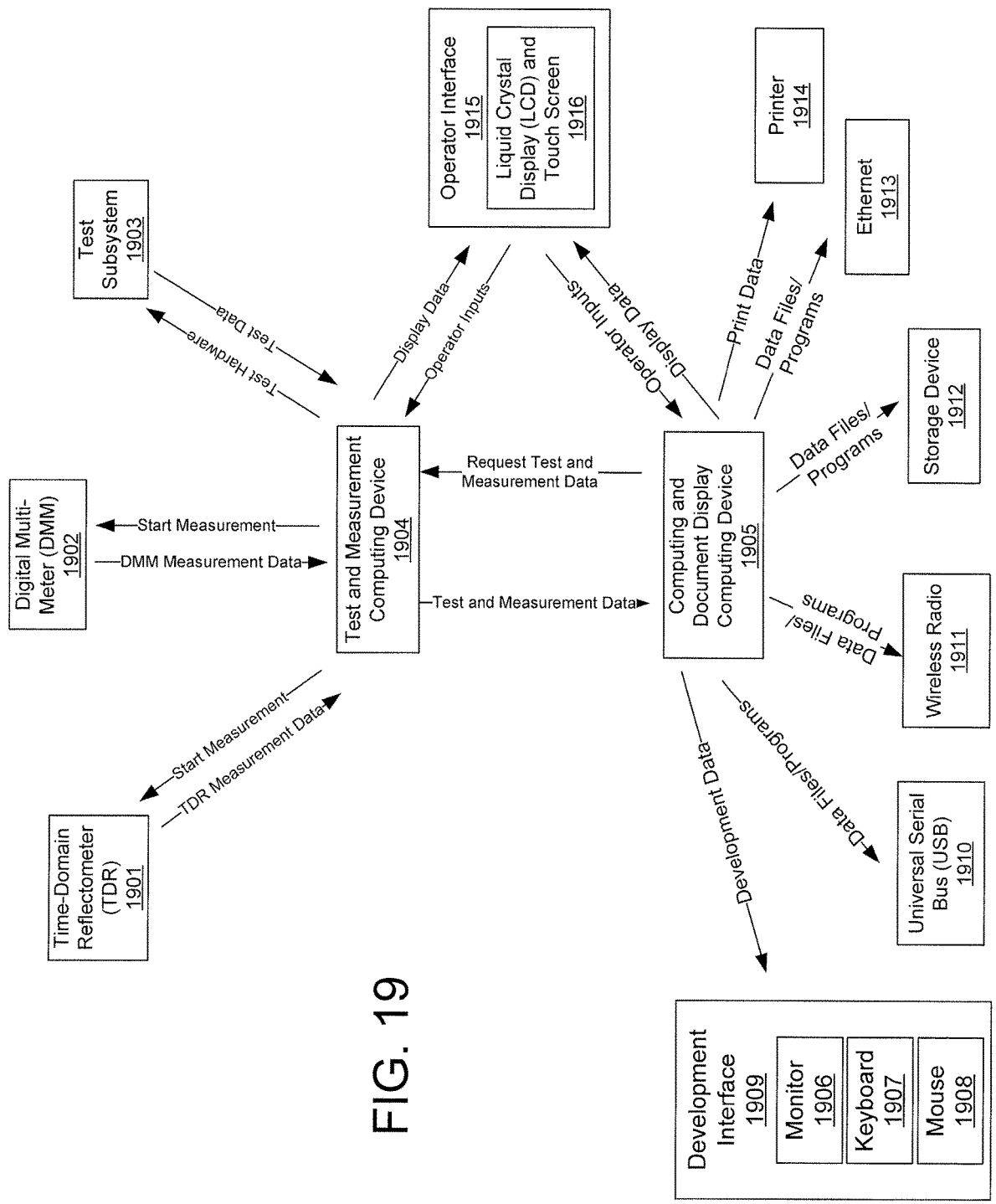
FIG. 19 is a block diagram depicting data flow of the host testing device with electronic document capability.

FIG. 19 depicts exemplary data flow of the testing device 1700 depicted in FIG. 17, inclusive of the microcontroller 1701. For purposes of description, the data flow chart comprises a test and measurement computing device 1904, which is inclusive of the processor 400 (FIG. 17) and the control logic 402 (FIG. 17). In this regard, operations taken by the test and measurement computing device 1904 are performed in the exemplary embodiment by the processor 400 and the control logic 402. Further, data obtained from measurements or configuration data used for purposes of data flow are stored in memory 401 (FIG. 17).

Likewise, for purposes of description, the data flow chart comprises a computing and document display computing device 1905, which is inclusive of the processor 1800 (FIG. 18) and the microcontroller control logic 1820 (FIG. 18). In this regard, operations taken by the computing device 1905 are performed in the exemplary embodiment by the processor 1800 and the control logic 1820.

During operation, the test and measurement computing device 1904 may initiate measurements of a system component. With reference to the data flowchart, the computing device 1904 may start a measurement by activating a time-domain reflectometer (TDR) 1901. The reflectometer 1901 transmits a signal onto the system component, e.g., a cable-under-test, and obtains data indicative of reflections along the cable-under-test, if any. Such data is collected and stored by the computing device 1904.

Likewise, the computing device 1904 may start a measurement by activating a digital multi-meter (DMM) 1902. The DMM 1902 measures, for example, direct current voltage, alternating current voltage, current and/or resistance in the cable-under test. Such data is collected and stored by the computing device 1904.

Further, other test such as are described herein with reference to testing devices shown in FIGS. 4 and 5 may also be performed on system components. In this regard, the computing device 1904 initiates a test of the test subsystem 1903. The test subsystem 1903 may be, for example, the circuitry 800 or 890 (FIG. 8) or adapter electronics that are coupled to the test and measurement computing device 1904. The test subsystem performs tests of the system component, and the computing device 1904 collects test data measured by the test subsystem 1903.

The measurement and test data are collected and stored by the computing device 1904. Note that the measurements taken by the TDR 1901, the DMM 1902, or the test subsystem 1903 are initiated by an operator (not shown). In this regard, an operator interface 1915 may include a liquid crystal display (LCD) and touch screen 1916. The operator may select one or all of the various operations to be performed by the computing device 1904 on the system component via the LCD and touch screen 1916. Furthermore, as measurement and test data are collected by the computing device 1904, the measurement and test data may be displayed to the LCD and touch screen 1916.

During operation, the computing and document display computing device 1905 may request test and measurement data from the computing device 1904, and the computing device 1904 provides data indicative of the measurement and test data to the computing device 1905. Further, based upon an operator input, the computing device 1904 may transfer control of the operator interface 1915 to the computing device 1905.

Based upon operator inputs received from the LCD and touch screen 1916, the computing device 1905 can perform a wide variety of functions. Notably, the computing device 1905 may interface with a printer 1914. Thus, the operator may print measurement and test data to the printer 1914. As will be described further herein, the computing device 1905 may also receive testing manuals, operator manuals or other documentation related to the system component or system being tested. Thus, the operator may also print such test manuals, operator manuals or other documentation to the printer 1914.

As is described with reference to FIG. 18, the computing device 1905 may comprise an Ethernet interface 1809 (FIG. 18) that interfaces with Ethernet 1913. Thus, the computing device may transmit data files and/or programs via the Ethernet to another device, e.g., a laptop or desktop computer, a printer (such as printer 1914), a storage device (such as storage device 1912).

Additionally, the computing device 1905 may directly interface with a nonresident storage device 1912. In this regard, the computing device 1905 may store data files and/or programs on the storage device 1912.

The computing device 1905 may interface with wireless radio 1911. As described with reference to FIG. 18, the microcontroller 1701 may have an onboard wireless transceiver 1805 (FIG. 18) with which to interface with the wireless radio 1911. Thus, the computing device 1905 may transmit data files and/or programs via wireless radio 1911 to other devices, for example a laptop or desktop computer, a handheld device (e.g., a cellular telephone), or a wireless network (not shown). Note that the computing device 1905 may connect with other components shown in the data flow chart, such as, for example the printer 1914, via the wireless radio 1911.

Further, the computing device 1905 may transmit data files and/or programs over a universal serial bus 1910. As described with reference to FIG. 18, the microcontroller 1701 may comprise a USB interface 1803 that interfaces with the USB 1910.

In addition, the computing device 1905 may connect to a development interface 1901, which includes a monitor 1906, a keyboard 1907, and a mouse 1908. Note that the computing device 1905 may connect to the components of the development interface 1909, for example, through the USB 1910, the wireless radio 1911, the Ethernet 1913, or any other dedicated connection that allows access to the computing device 1905. In regards to the development interface 1901, a developer (not shown) may develop control logic 1820 (FIG. 18) for implementation and execution by the computing device 1905.

Figure 20:
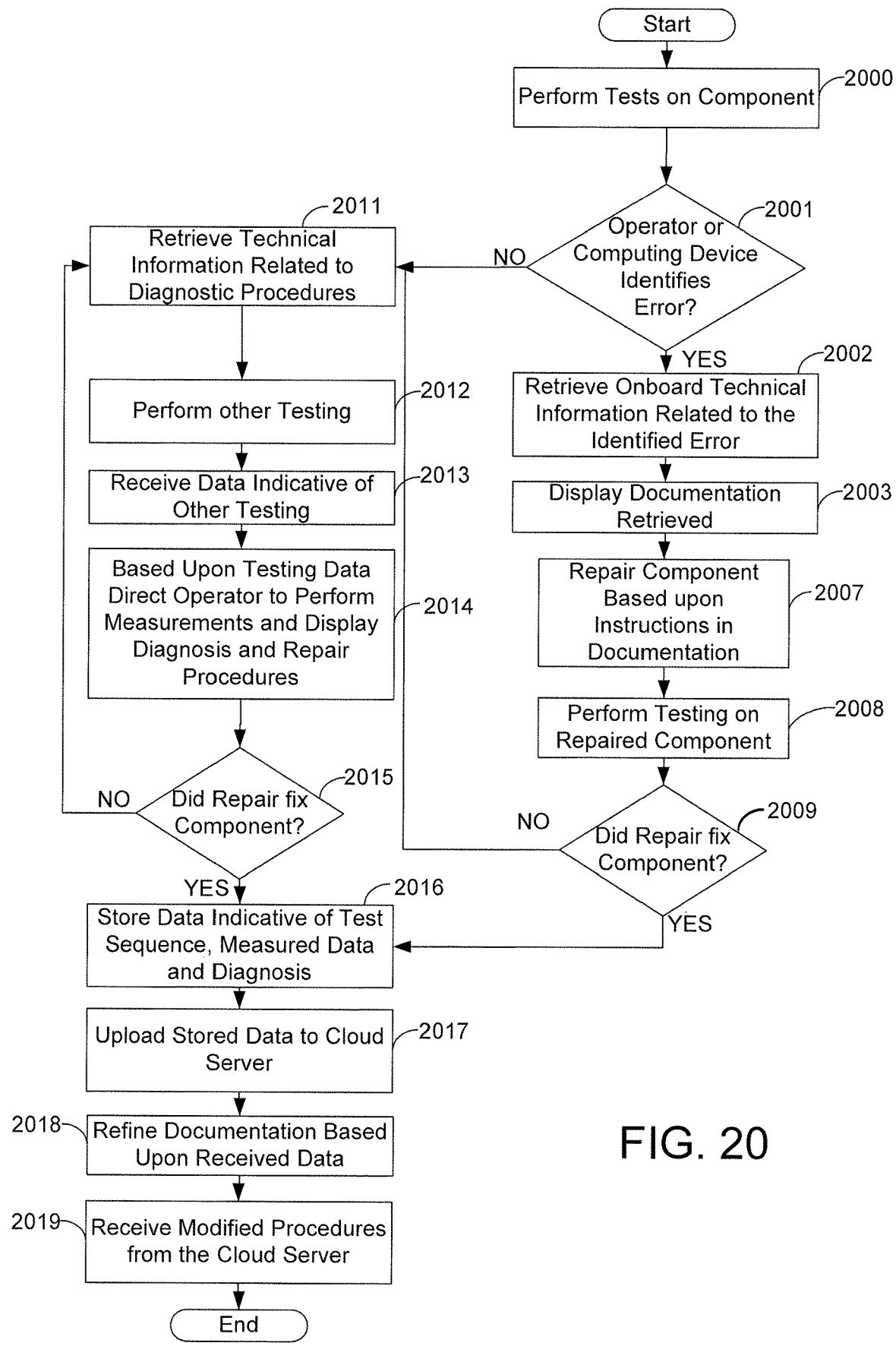
FIG. 20 is a flowchart depicting exemplary architecture and functionality of the host testing device such as is depicted in FIG. 17 having electronic document capability.

The architecture and functionality of the foregoing device 1700 (FIG. 17) comprising the microcontroller 1701 (FIGS. 17 and 18) and the data flow depicted in FIG. 19 is now described with reference to FIG. 20. Furthermore, FIG. 16 is applicable to the following description and appropriate reference numerals from FIG. 16 will also be used in the following description.

In step 2000 an operator initiates tests on a component, e.g., a cable or other electronic component, using the testing device 1700 (FIG. 17). As described hereinabove, tests may be performed on a system component, e.g., a cable, using the test subsystem 1903 (FIG. 19), a TDR 1901 (FIG. 19), a DMM 1902 (FIG. 19) or adapter electronic functions. Note that the identified devices for testing the system component are exemplary, and other devices and/or methods may be used to test the system component and receive operational data indicating the integrity of the system component. While the present disclosure provides an exemplary system component, i.e., a cable-under-test, the testing device 1700 may also be used to test other system components other than cables.

In step 2001, the test and measurement computing device 1904 receives test and measurement data from the subsystem 1903, the TDR 1901, the DMM 1902, or adapter electronics. In addition, the computing device 1905 requests the test and measurement data from the computing device 1904. The computing device 1905 determines, based upon the data received, if the system component is working properly.

If the tester or computing device 1905 determines that the test and measurement data indicate an error and the tester identifies the error in documentation onboard the testing device 1700, as indicated in step 2001, the computing device 1905 retrieves documentation related to the identified error from onboard memory 401 (FIG. 17) or memory 1801 (FIG. 18), as indicated in 2002. Note that the documentation retrieved may comprise a variety of technical information, including a series of operational questions and corresponding answers to the questions, diagnostic information, repair information, and/or retesting information. Notably, the technical information retrieved is based upon the error identified by either the operator or the computing device 1905. In one embodiment, the operator may manually respond to the questions or the testing device 1700 may automatically take additional measurements based upon the documentation. Such documentation is hereinafter referred to as "smart" documentation or "smart" procedures. Regardless, the operator, in conjunction with automated process on the testing device 1700, may walk through a series of questions and inquiries to determine a cause of malfunction or otherwise.

As indicated, in one embodiment, documentation related to the error is stored in memory 1801 (FIG. 18) as user document data 1807 (FIG. 18), and the computing device 1905 retrieves the documentation from the resident memory 1801. In one embodiment, the documentation data 1807 may be a portable document format (.pdf) file, and the control logic 1820 (FIG. 18) executes application logic 1808 to display the documentation 1807 to the display and touch screen 1916. Note that the user document data 1807 may be in any type of format known in the art or future-developed. In this regard, the document data 1807 may be interactive, as described hereinabove. In this regard, the document data 1807 may display text having hyperlinks to allow the operator to pull up additional information or documents either resident on the testing device 1700, microcontroller 1701, or via the Internet 1601 (FIG. 16) from the computer network, internet or cloud servers 1602. Furthermore, in step 2003, the computing device 1905 displays the retrieved documentation to the operator via the LCD and touch screen 1916.

In step 2007, an operator repairs the component based upon the technical information received from onboard memory 401 or 1801. Thereafter, the operator performs testing on the repaired component, in step 2008.

If the repairs suggested by the onboard technical information fixes the error in the system component, as indicated in step 2009, the testing device 1701 stores data indicative of the test sequence, measured data, and diagnosis in memory 401 or 1801, as indicated in step 2016. Thereafter, this data is uploaded to the computer network, internet or cloud servers 1602, as indicated in step 2017, and documentation and instructions at the computer network, internet or cloud servers 1602 may be modified accordingly to reflect the error in the component, the diagnosis, and the test and repair sequence, as indicated in step 2018. Modified procedures based upon the data may then be downloaded and received by the testing device 1700, as indicated in step 2019.

Note that in one embodiment, the data indicative of the repair may be uploaded via the wireless radio 1911 (FIG. 19), the Ethernet 1913 (FIG. 19), the USB 1910 (FIG. 19) or the Bluetooth® transceiver 1881 (FIG. 18) to the Internet 1601 (FIG. 16) and to the computer network, internet or cloud servers 1602 (FIG. 16). The server may then use the data received to automatically update the documentation or the documentation may be refined and edited manually in response to the data received related to the use of the documentation in the repair of the cable-under-test.

If in step 2001 the operator or computing device does not identify the error, the testing device 1701 retrieves technical information related to diagnostic procedures from the computer network, internet or cloud servers 1602, as indicated in step 2011 related to the particular error received. As noted hereinabove, the technical information may include "smart" documentation or "smart" procedures that aid the operator in diagnosing an error on the component being tested.

In step 2012, additional testing may be performed based upon the technical information retrieved from the computer network, internet or cloud servers 1602, which may suggest a particular test be performed to identify the error. In one embodiment, the computing device 1904 performs the additional testing automatically based upon the technical information. In another embodiment, the computing device 1904 may direct the operator to troubleshoot other subsystem components, e.g., power supplies, computing, communication, aviation black boxes, etc. using the tester on-board and optional plug-in adapter measurement components.

In step 2013, the computing device 1904 receives data indicative of the additional testing. In this regard, the operator may enter data or the tester may automatically test and obtain test data.

In step 2014, based upon the testing data received, the computing device 1905 may direct the operator to take additional measurements or may display diagnosis and repair procedures or other technical information relevant to diagnosing and/or fixing the error identified.

In step 2015, if the repair procedures employed at the direction of the documentation repaired the components, the testing device 1701 stores data indicative of the test sequence undergone during the procedure, measured data and diagnosis. The computing device 1905 then uploads this stored data to the computer network, internet or cloud servers 1602 (FIG. 16). Upon receipt of the stored data by the computer network, internet or cloud servers, the computer network, internet or cloud servers 1602 may modify the procedures or any other data received as indicated in step 2018, and download the modified procedures to the tester or a field of testers, as indicated in step 2019. Therefore, the computing device 1905 receives the modified procedures from the computer network, internet or cloud servers 1602. Notably, the newly modified procedures may be used in future testing and troubleshooting performed with the computing devices 1904, 1905 or by the operator.

FIG. 21 depicts a wire and cable high voltage insulation testing system 2100 in accordance with an embodiment of the present disclosure. The system 2100 performs testing on a cable 2106 to determine if insulation of the cable 2106 has been compromised. The system 2100 comprises a host controller device 2101 that is communicatively coupled via a wireless link 2107 to a high voltage insulation testing device 2101. The host controller device 2101 transmits test commands to the testing device 2101 over the wireless link 2107, and in response, the testing device 2102 performs tests on the cable 2106. Note that in the system 2100, because communication between the host controller device 2101 and the testing device 2101 is wireless, there is no galvanic connection between the host controller device 2101 and the testing device 2102. Thus, there is no risk that an operator of the host controller device 2101 will be exposed to any high voltages that are used in testing.

The testing device 2102 comprises adaptor 2103 that couples to the cable 2106 via a connector 2105 at a first end of the cable 2106 and a connector 2104 at a second end of the cable 2106. Note that the adaptor 2103 may connect to a multiple pin connector. For example, the testing device 2102 may comprise a 128-pin connector, and the adaptor 2103 couples to the 128-pin connector.

During operation, the testing device 2102 is controlled by the host controller 2101. The host controller device 2101 transmits testing commands to the testing device 2102 via the wireless link 2107. The commands transmitted define the test to be performed on the cable 2106 by the testing device 2102.

As an example, the host controller device 2101 transmits data via the wireless link 2107 indicative of a high voltage, e.g., 1000 Volts (V), to be applied to the cable 2106. Additionally, the host controller device 2101 transmits data indicative of a test limit, e.g., 2 milliamps (mA). In the example, in response to receiving the data indicative of the voltage and the test limit, the testing device 2102 applies the indicated high voltage to a wire of the cable 2106 via the connector 2104, and connects all other wires to a common ground reference. The testing device 2102 measures the amperage from the high voltage wire to the grounded wires of the cable 2106 via the connector 2105, and compares the measured amperage to the test limit. In the example provided, if the measured amperage is greater than the test limit, this indicates that there was an insulation failure.

The host controller device 2101 may transmit other data indicative of other commands to the testing device 2102. For example, the data transmitted by the host controller device 2101 may indicate a start time for the test, a duration of the test, and/or which pins on the adapter are grounded and to which pins to apply voltage.

Thus, the testing device 2102 tests the operability and functionality of the cable 2106 to determine the integrity of the insulation on the cable 2106. The testing device 2102 records the results of the testing and transmits the results to the host controller device 2101.

FIG. 22 depicts another wire and cable high voltage insulation testing system 2200 in accordance with another embodiment of the present disclosure. The system 2200 comprises a host controller device 2201 that is communicatively coupled to three testing devices 2202-2204 via wireless links 2209-2211, respectively. Note that three testing devices 2202-2204 are shown for exemplary purposes. The system 2200 may comprise more or fewer testing devices in other embodiments of the present disclosure.

Each testing device 2202-2204 comprises a respective adaptor 2205-2207 that couples each testing device 2202-2204 to a portion of a high voltage cable 2208 via respective connectors 2212-2214. Note that the adaptors 2205-2207 may connect to a multiple pin connector. For example, the testing devices 2202-2204 may comprise a 128-pin connector, and the adaptors 2205-2207 couple to the 128-pin connector.

During operation, the testing devices 2202-2204 are controlled by the host controller device 2201. In this regard, the host controller device 2201 transmits testing commands to the testing devices 2202-2204 via the wireless link 2107. The commands transmitted by the host controller device 2201 define the test to be performed by the testing devices 2202-2204.

Similar to the single testing device system 2100 discussed with reference to FIG. 21, the host controller device 2101 may transmit data to the testing device 2202 to apply a particular voltage, e.g., 1000 V, to the cable 2208. In addition, the host controller device 2101 may transmit data indicative of a test limit, e.g., 2 mA, to the testing device 2204. The testing device 2204 measures the amperage on the cable 2208 in response to the high voltage being applied, and compares the amperage to the test limit. If the measured amperage is greater than the test limit, this indicates that insulation on the cable 2208 is compromised.

Thus, the testing devices 2202-2204 each test the operability and functionality of a portion of the cable 2208. The testing devices 2202-2204 record the results of the testing and transmit the results to the host controller device 2201.

Figure 23:
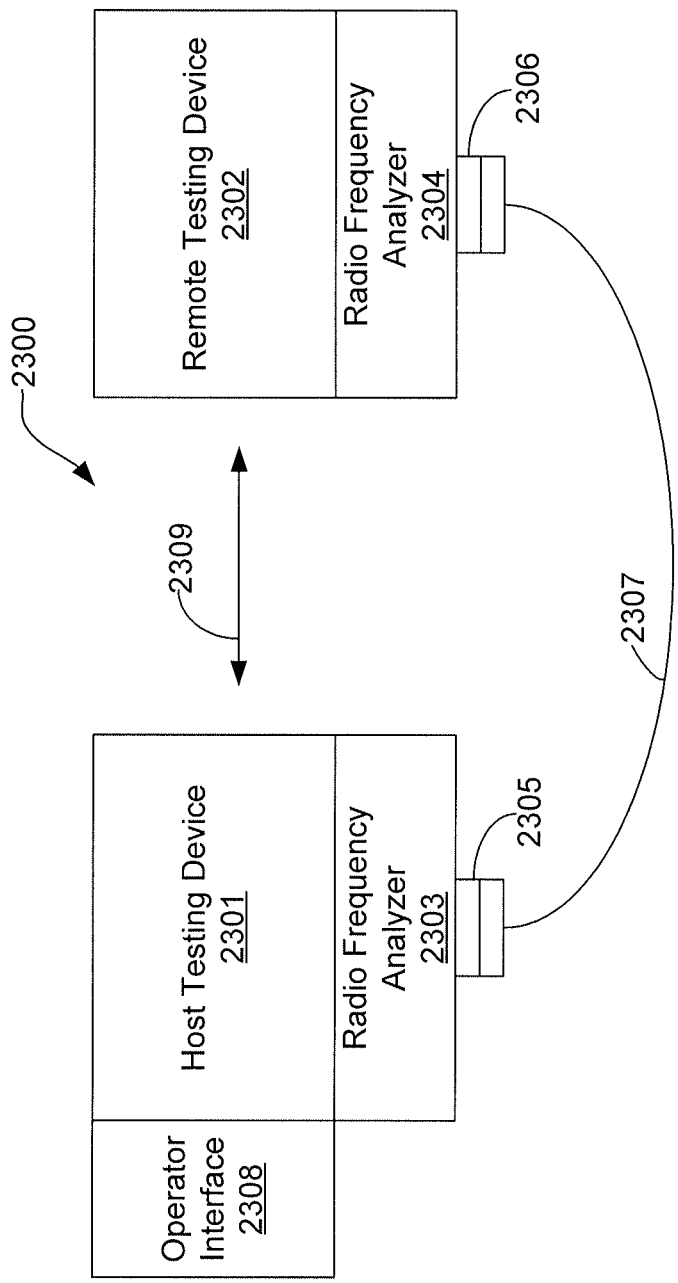
FIG. 23 is a block diagram of a radio-frequency analyzer testing system using two testers in accordance with an embodiment of the present disclosure.

FIG. 23 depicts a system 2300 in accordance with another embodiment of the present disclosure. The system 2300 tests a conductor cable 2307 for voltage standing wave ratio (VSWR) and insertion loss for particular frequencies, e.g., 1 MHz to 10 GHz.

The system 2300 comprises a host testing device 2301 that is similar in hardware, software, and functionality of the host testing device 101 (FIG. 1) that has been described throughout the present disclosure. However, coupled to the host testing device 2301 is an adapter having hardware, software, and/or firmware cable of testing radio frequencies. This adaptor may plug into an adapter interface on the host testing device 2301, which can be, for example, a 128-pin connector or a series of spring contacts that interface with connections on the adaptor. The host testing device 2301 comprises an operator interface 2308, which can be, for example, a touchscreen.

Additionally, the system 2300 comprises a remote testing device 2302. The host testing device 2301 is communicatively coupled to the remote testing device 2303 via a wireless link 2309.

Note that as described hereinabove with reference to host testing device 101 and remote testing device 102, whether a testing device is a host testing device depends upon whether a test program has been selected. In this regard, control logic (not shown) similar to control logic 402 (FIG. 4) may display a list of types of adapters to the operator, and the operator may select an RF analyzer adaptor from the list. Additionally, the control logic may display a list of test programs, and once a test program is selected from the list, the testing device becomes the host testing device 2301.

The host testing device comprises a radio frequency (RF) analyzer 2303 that is coupled to one end of a cable 2307 via a connector 2305. The remote testing device 2302 comprises a radio frequency (RF) analyzer 2304 that couples to a second end of the cable 2307 via a connector 2306. Note that in one embodiment, the RF analyzers 2303 and 2304 couple to a multiple pin connector of the host testing device 2301 and the remote testing device 2302. In one embodiment, the host testing device 2301 and remote testing device 2302 comprise a 128-pin connector that couples to the RF analyzers 2303 and 2304, respectively.

During operation, host testing device 2301 transmits commands via the wireless link 2309 to the remote testing device 2302. For example, the host testing device may transmit data indicative of power applied to the cable 2307 through connector 2305. The RF analyzer 2303 applies alternating current (A/C) power stimulus to the cable 2307. In response, the RF analyzer 2304 measures the power resulting from the stimulus via the connector 2306. In one embodiment, the remote testing device 2302 transmits data indicative of the power measured to the host testing device 2301 via the wireless link 2309. In response to receiving the data indicative of the power measured, the host testing device 2301 determines insertion loss by comparing the power in/power out ratio to a test limit.

In another embodiment, the host testing device 2301 may transmit a command to the remote testing device 2302 instructing the remote testing device 2302 to terminate the cable (serve as a load only) to the cable 2307 via the connector 2306. In such a test, the RF analyzer 2303 applies a particular frequency (or range of frequencies) to the cable 2307. Because the cable 2307 is terminated at the remote testing device 2302, the RF analyzer 2303 can measure the resulting reflection of the applied signal to determine VSWR. The remote testing device 2302 transmits data indicative of the resulting reflection to the host testing device 2301. In response to receiving the data indicative of the resulting reflection, the host testing device 2301 compares the VSWR against a test limit and determines whether the cable being tested passes or fails.

The host testing device 2301 may receive input from the operator interface 2308, e.g., as a touchscreen, for selecting the frequency range for a test of the cable 2307. Further, the host testing device 2301 may display test results to the operator interface 2308. Additionally, the operator may input data indicative of pass/fail test limits.

Figure 24:
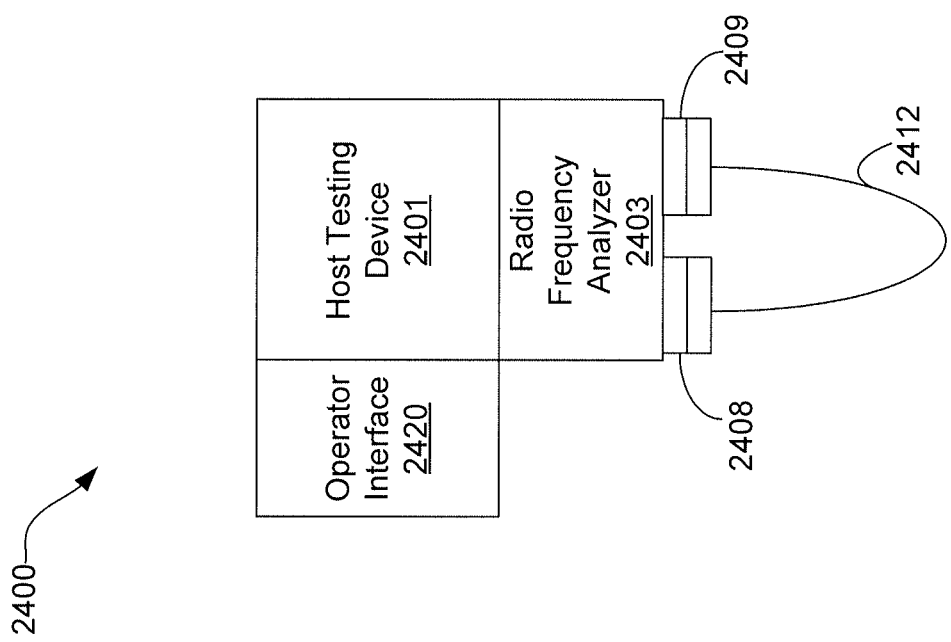
FIG. 24 is a block diagram of a radio-frequency analyzer testing system using a single tester in accordance with an embodiment of the present disclosure.

FIG. 24 depicts a system 2400 in accordance with an embodiment of the present disclosure. The system 2400 comprises a host testing device 2401 that serves as a single tester.

The host testing device 2401 comprises an operator interface 2420 for receiving input from a user (not shown) and displaying output to the user. In this regard, the operator interface 2420 may comprise a touchscreen. In such an embodiment, the user may enter testing parameters via the operator interface 2420 to the host testing device 2401. Further, the host testing device 2401 may display test results to the user via the operator interface 2420.

The host testing device 2401 comprises an RF analyzer 2403 that is coupled to a cable 2412 via connectors 2408 and 2409. The host testing device 2401 may be used to test insertion loss and VWSR of the cable 2412.

As an example, to test the insertion loss using the single host testing device 2401, the host testing device 2401 transmits a signal to the RF analyzer 2403 to apply power to the cable 2412 through connector 2408. In response to the application of power to the cable 2412, the RF analyzer 2403 measures the resulting power through connector 2409. The host testing device 2401 compares the power applied to the resulting power to determine insertion loss.

What is claimed is:

1. A system, comprising:
a host testing device comprising a first wireless transceiver and host testing device logic, wherein the host testing device logic transmits a test command via the first wireless transceiver and the host testing device couples to one or more wires emanating from a first end of a cable; and
a first remote testing device comprising a second wireless transceiver and remote testing device logic, the second wireless transceiver communicatively couples to the first wireless transceiver, and the first remote testing device couples to one or more wires emanating from a second end of the cable,
wherein the host testing device receives cable data defining connections for connecting the first remote testing device to the one or more wires emanating from the second end of the cable and cable data defining connections for connecting the host testing device to the one or more wires emanating from the first end of the cable, the first remote testing device receives the test command transmitted by the host testing device logic to the first remote testing device, wherein the test command transmitted by the host testing device logic comprises data indicative of a wire being tested and data indicative of an action to be taken with respect to the wire being tested, and the first remote testing device logic couples the one or more wires emanating from the second end of the cable to ground except the wire being tested based on the test command.

2. The system of claim 1, further comprising a computing device communicatively coupled to the host testing device that transmits a test program to the host testing device, the test program comprising the test command.

3. The system of claim 1, wherein the first remote testing device logic connects the one or more wires coupled to the remote testing device to ground based on the test command and the host testing device logic connects the one or more wires coupled to the host testing device to ground except the wire being tested to perform a continuity test.

4. The system of claim 3, wherein the host testing device logic further calculates resistance in the wire being tested.

5. The system of claim 4, wherein the host testing device logic compares the calculated resistance with a continuity test limit indicated in the cable data.

6. The system of claim 5, wherein the host testing device further comprises an output device and the host testing device logic further data indicative of a test pass if the resistance in the wire is less than the continuity test limit.

7. The system of claim 5, wherein the host testing device further comprises an output device, the host testing device logic further compares the calculated resistance with an isolation resistance test limit indicated in the cable data, if the calculated resistance is greater than the continuity test limit and less than the isolation resistance test limit in the cable data, the host testing device logic further displays data indicative of a test failure.

8. The system of claim 5, wherein the host testing device further comprises an output device and the host testing device logic further displays data indicative of a test failure if the resistance in the wire being tested is greater than the isolation resistance test limit.

9. The system of claim 1, wherein the host testing device logic further connects the one or more wires emanating from the first end of the cable and coupled to the host testing device to ground and the host testing device logic further connects the one or more wires emanating from the second end of the cable and coupled to the remote testing device to ground on the remote testing device except the wire being tested, and the host testing device logic measures an isolation resistance between the wire being tested and ground.

10. The system of claim 9, wherein the host testing device further comprises an output device and the host testing device logic further displays data indicative of a test failure if the measured isolation resistance in the wire being tested is less than an isolation resistance test limit.

11. The system of claim 9, wherein the host testing device further comprises an output device and wherein if the measured isolation resistance is greater than the isolation resistance test limit, the host testing device logic further displays data indicative of a test pass to the output device.

12. The system of claim 1, wherein the host testing device comprises a digital multimeter for measuring direct current voltage, alternating current voltage, current or resistance of the system component.

13. The system of claim 12, wherein the host testing device logic measures a voltage via the digital multimeter and performs a test based upon the voltage measured.

14. The system of claim 13, wherein the host testing device logic retrieves technical information based upon a test result of the test.

15. The system of claim 1, wherein the host testing device comprises a time domain reflectometer for detecting a distance to an open circuit or a short circuit in the system component.

16. The system of claim 15, wherein the host testing device logic measures a distance via the time domain reflectometer and performs a test based upon the distance measured.

17. The system of claim 16, wherein the host testing device logic retrieves technical information based upon a test result of the test.

18. The system of claim 17, wherein the technical information retrieved is a computer-aided design drawing representing a map of a system comprising the system component.

19. The system of claim 18, wherein the host testing logic further identifies the drawing a location of the open circuit or short circuit and displaying to the user an identifier identifying where in the system the open circuit or short circuit is located.

20. The system of claim 1, further comprising a second remote testing device coupled to one or more wires emanating from a third end of the cable.

21. The system of claim 20, wherein the host testing logic further tests a portion of the cable coupling the host testing device with the first remote testing device without testing a portion of the cable coupling the host testing device with the second remote testing device.

* * * * *